(12) United States Patent
Yang

(10) Patent No.: US 7,625,790 B2
(45) Date of Patent: Dec. 1, 2009

(54) FINFET WITH SUBLITHOGRAPHIC FIN WIDTH

(75) Inventor: Haining S. Yang, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 49 days.

(21) Appl. No.: 11/828,403

(22) Filed: Jul. 26, 2007

(65) Prior Publication Data

US 2009/0026543 A1    Jan. 29, 2009

(51) Int. Cl.
*H01L 29/00* (2006.01)
(52) U.S. Cl. ............................... 438/198; 257/E21.001
(58) Field of Classification Search ................. 438/198, 438/197; 257/288, E21.001
See application file for complete search history.

(56) References Cited

U.S. PATENT DOCUMENTS

| 2006/0134556 | A1* | 6/2006 | Nealey et al. | ................ 430/311 |
| 2006/0175667 | A1* | 8/2006 | Tsuchiaki | .................... 257/391 |
| 2007/0001173 | A1* | 1/2007 | Brask et al. | .................... 257/67 |

OTHER PUBLICATIONS

Yang, Haining, U.S. Appl. No. 11/424,963, filed Jun. 19, 2006, Title: "Sub-Lithographic Feature Patterning Using Self-Aligned Self-Assembly Polymers".
Nealey, Paul F. et al., "Self-assembling resists for nanolithography", IEDM Technical Digest, Dec. 2005, Digital Object Identifier 10.1109/IEDM.2005.1609349.

* cited by examiner

*Primary Examiner*—Matthew Smith
*Assistant Examiner*—Michele Fan
(74) *Attorney, Agent, or Firm*—Scully, Scott, Murphy & Presser, P.C.; H. Daniel Schnurmann

(57) ABSTRACT

At least one recessed region having two parallel edges is formed in an insulator layer over a semiconductor layer such that the lengthwise direction of the recessed region coincides with optimal carrier mobility surfaces of the semiconductor material in the semiconductor layer for finFETs to be formed. Self-assembling block copolymers are applied within the at least one recessed region and annealed to form a set of parallel polymer block lines having a sublithographic width and containing a first polymeric block component. The pattern of sublithographic width lines is transferred into the semiconductor layer employing the set of parallel polymer block lines as an etch mask. Sublithographic width semiconductor fins thus formed may have sidewalls for optimal carrier mobility for p-type finFETs and n-type finFETs.

11 Claims, 15 Drawing Sheets

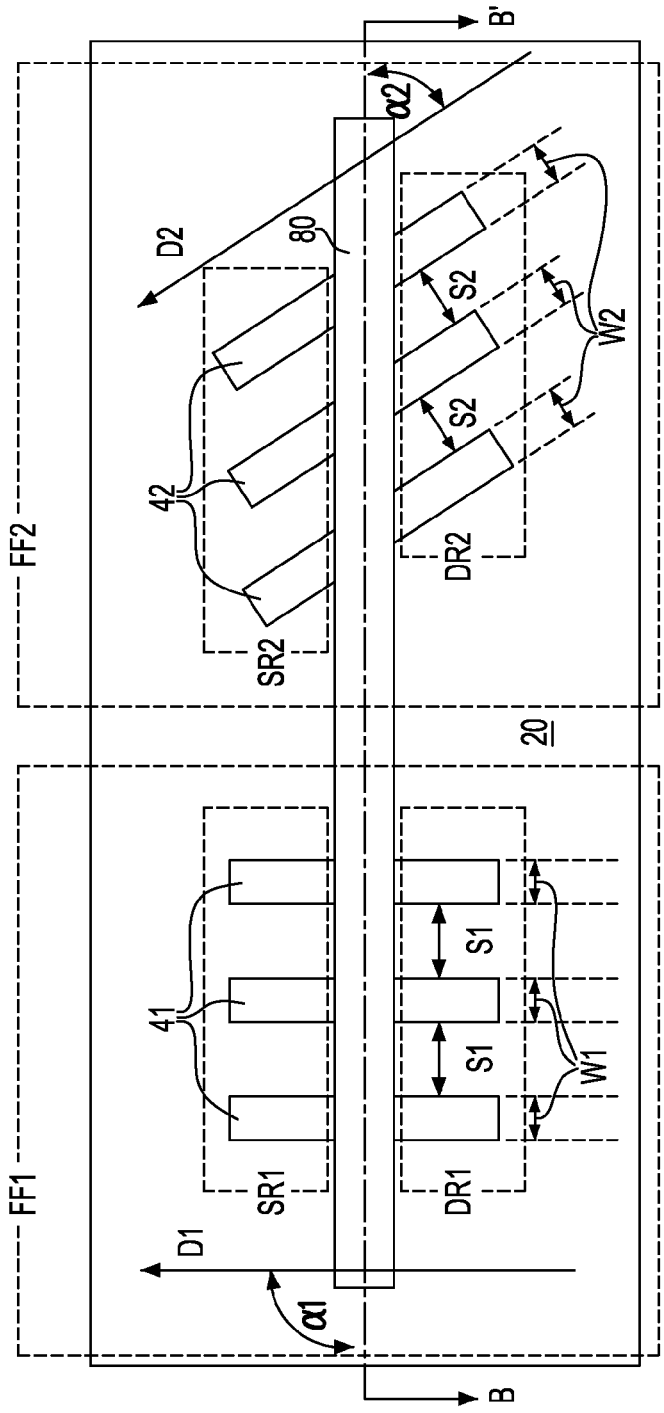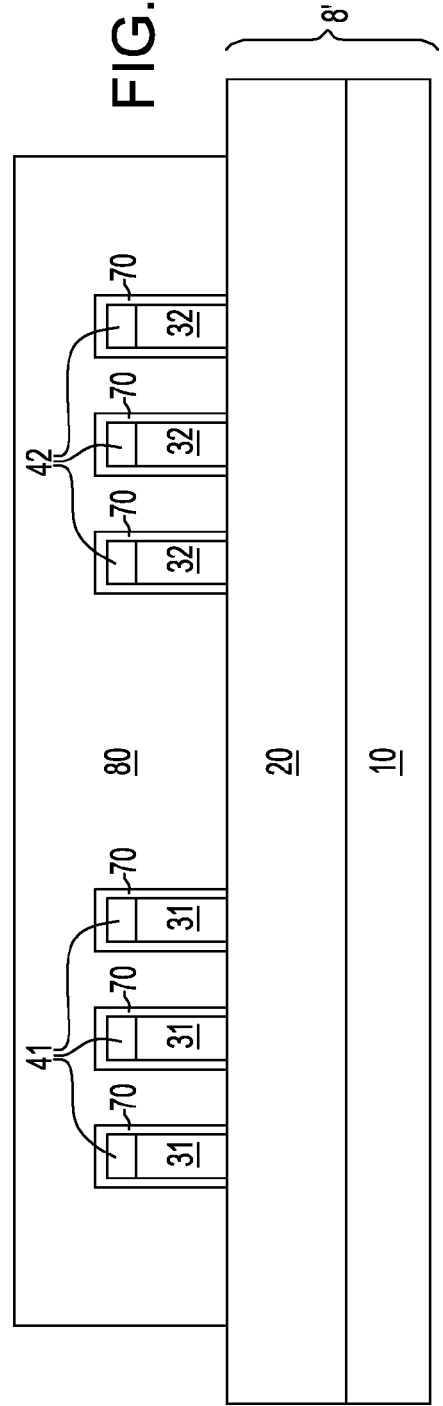

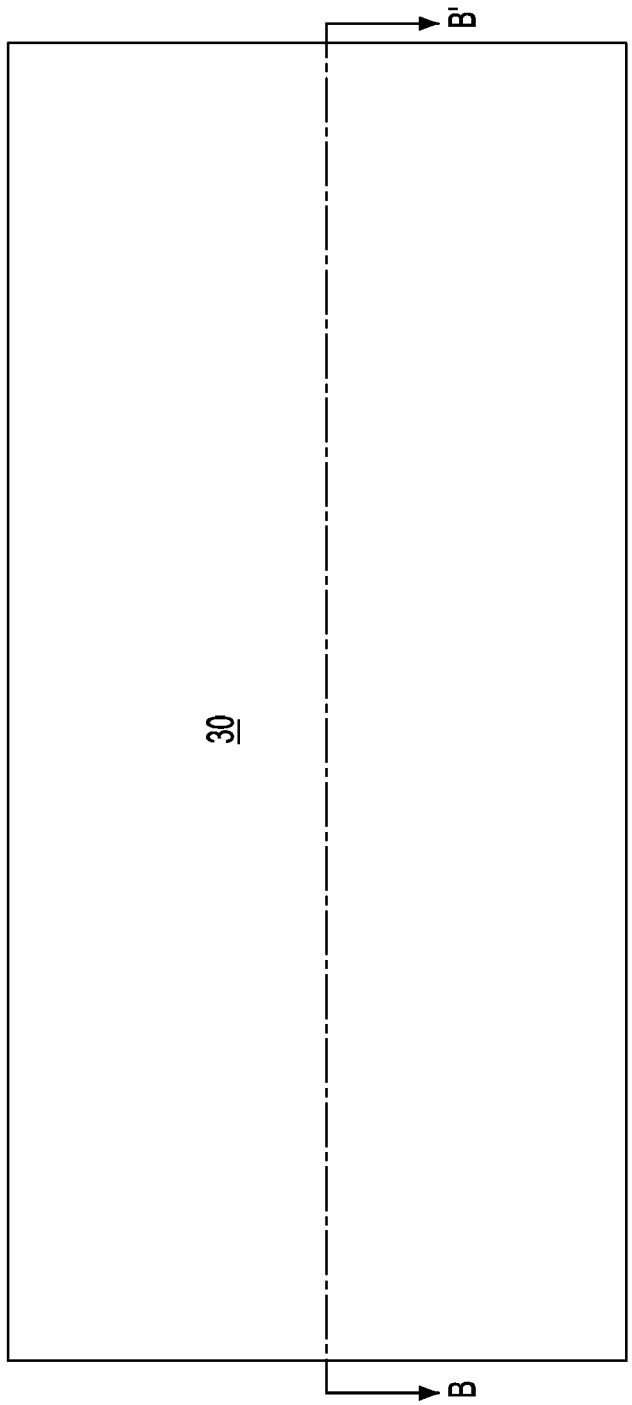

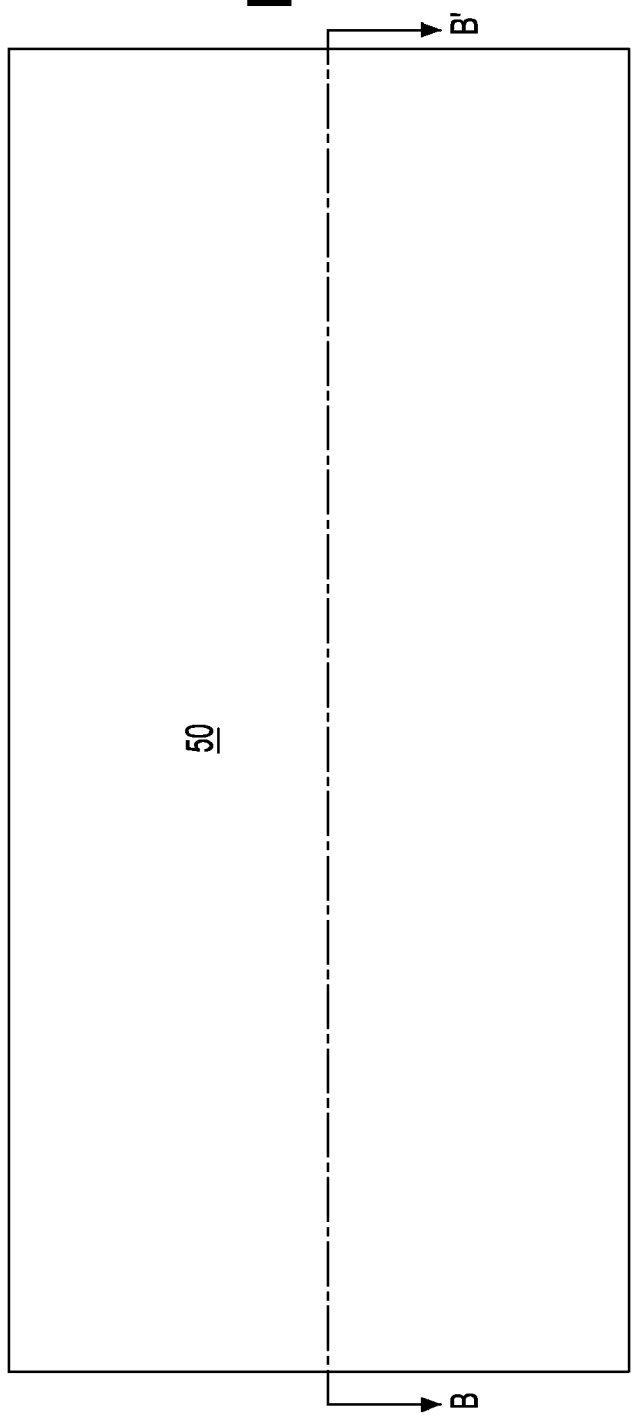

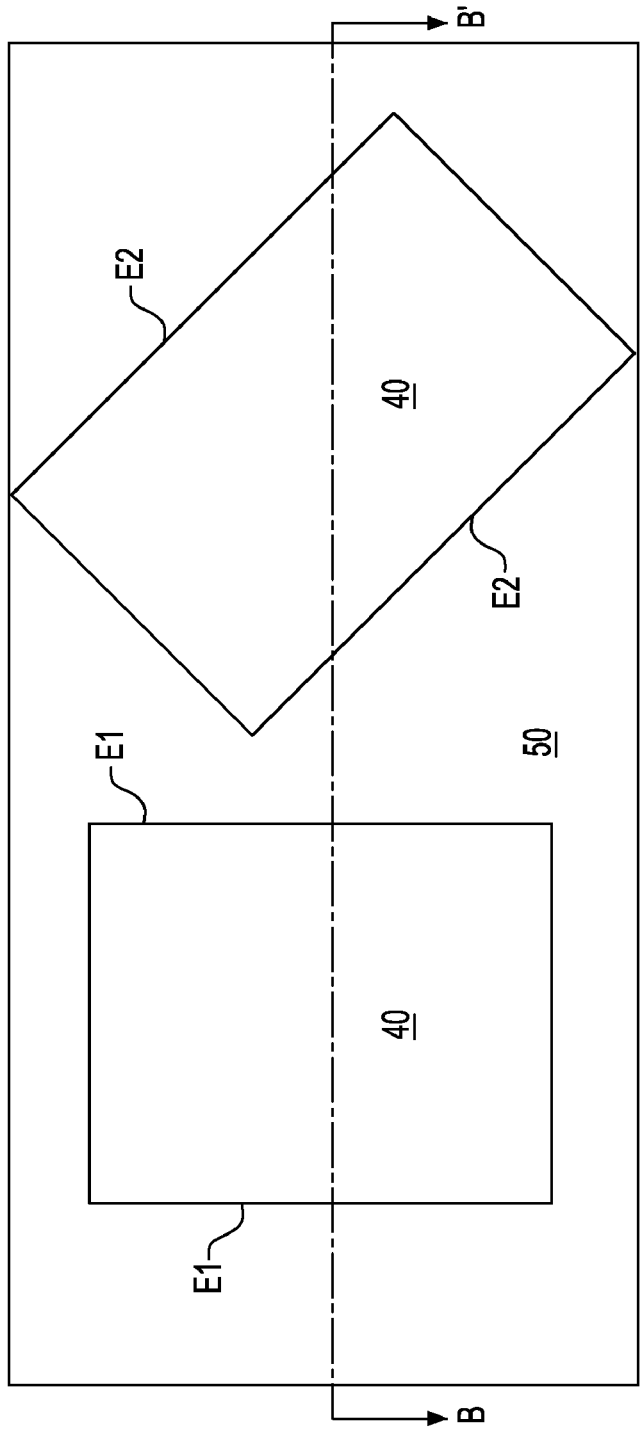

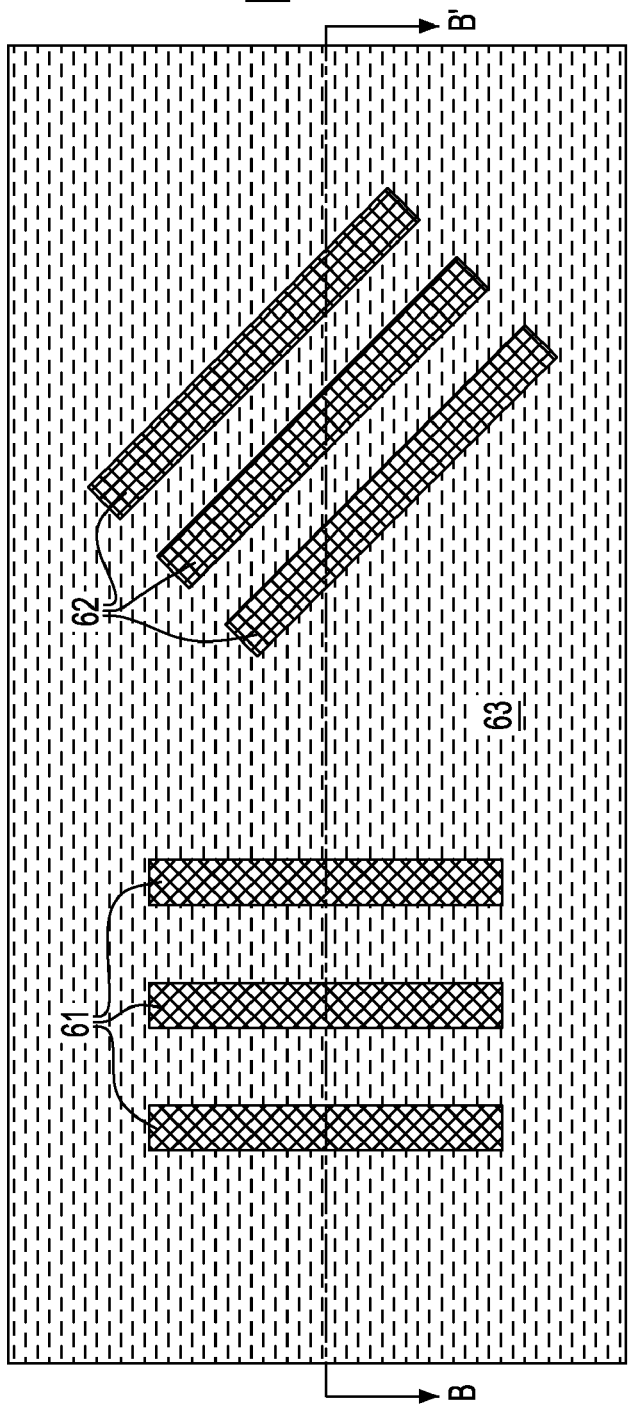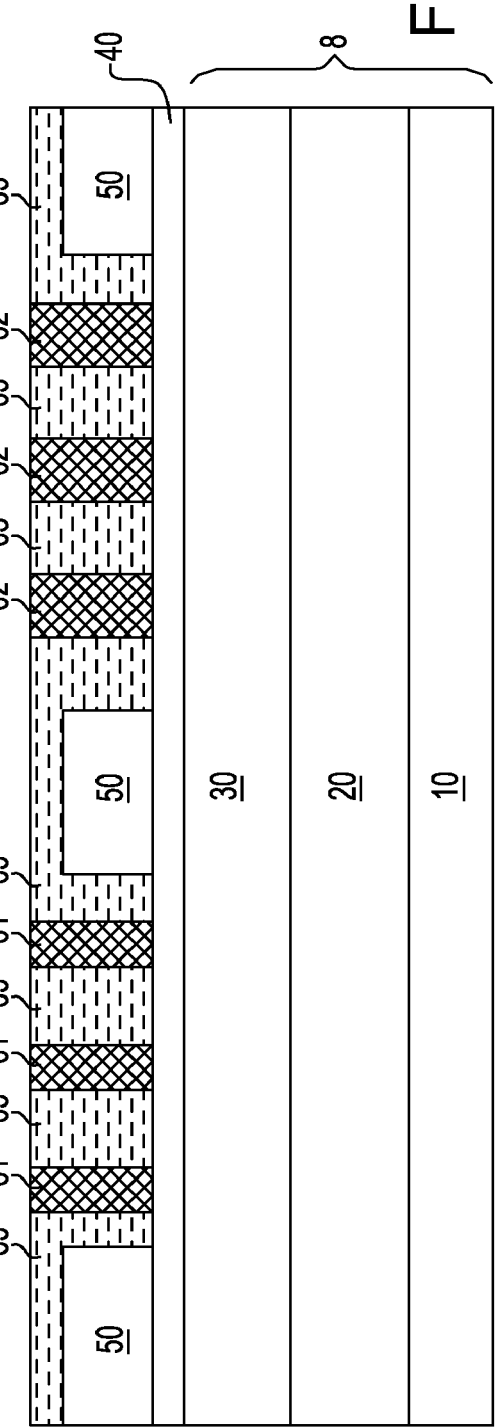

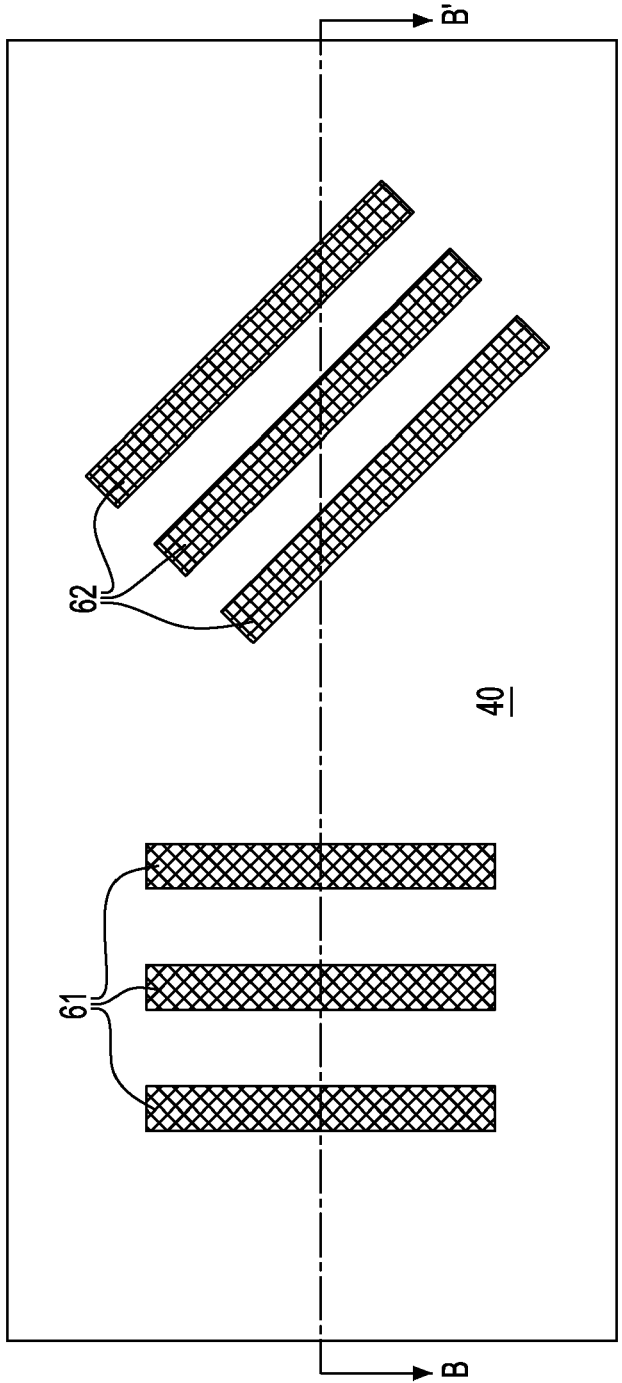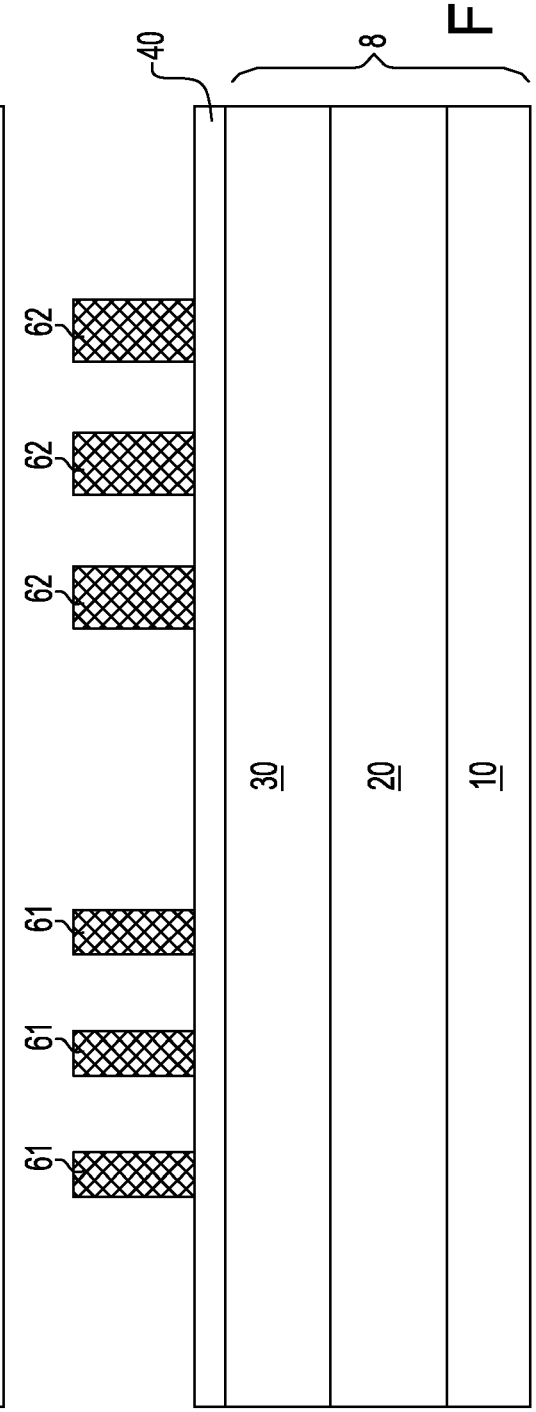

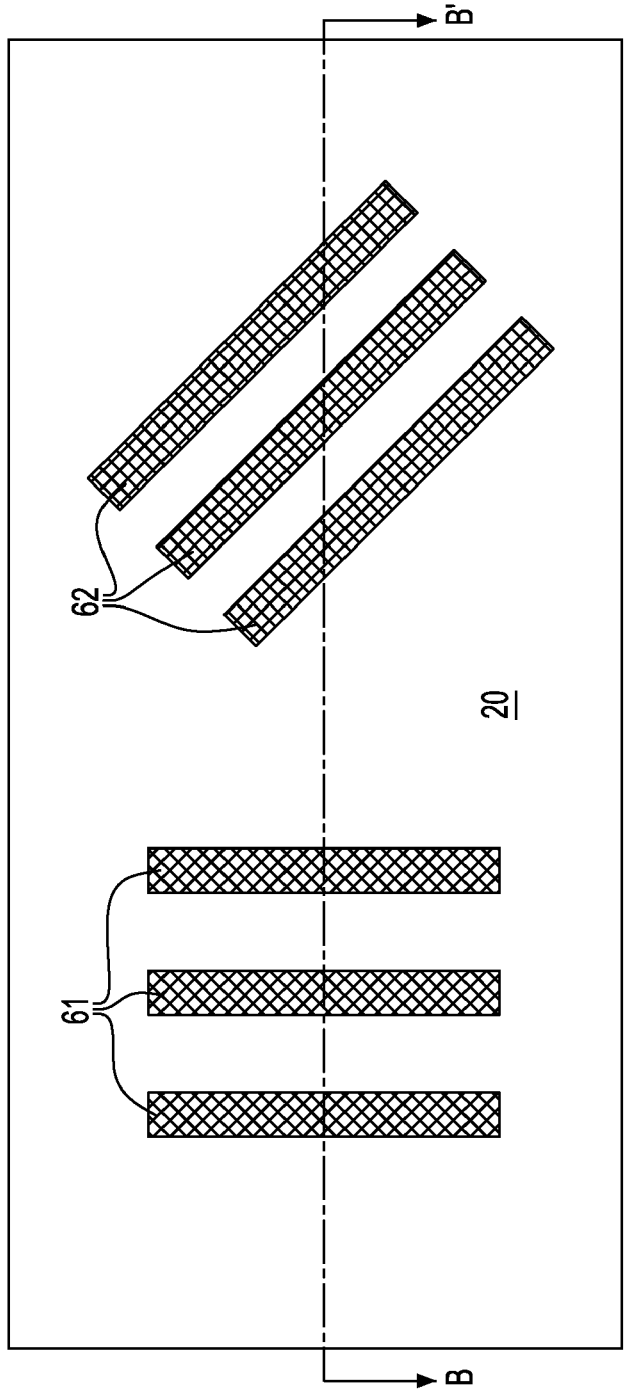
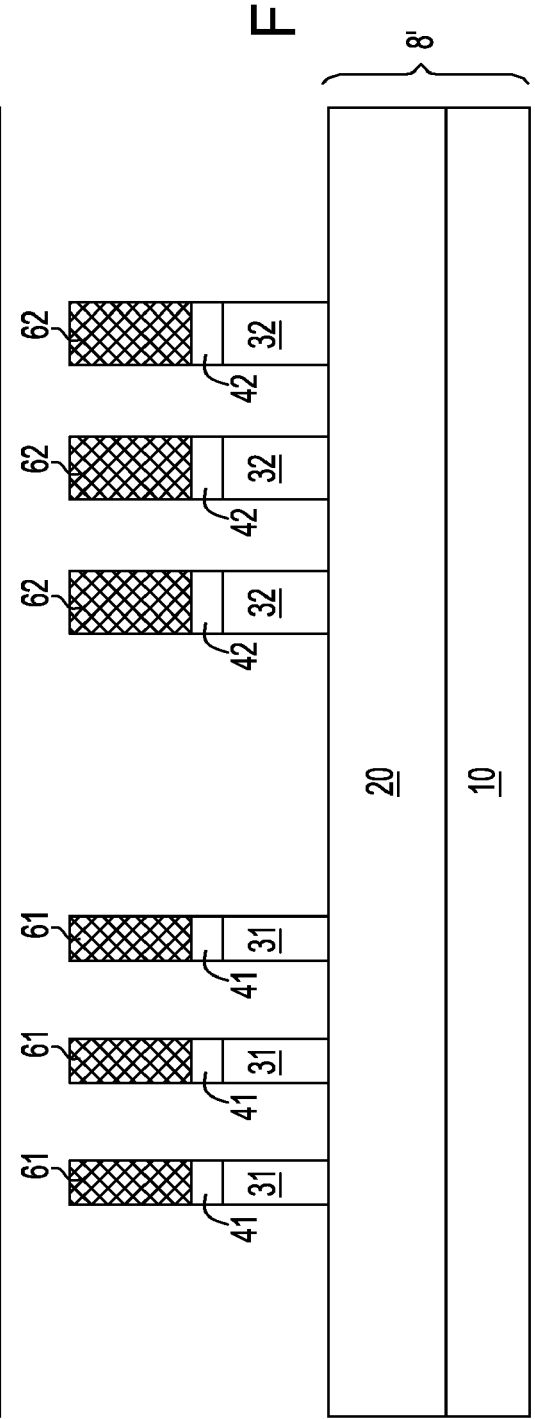

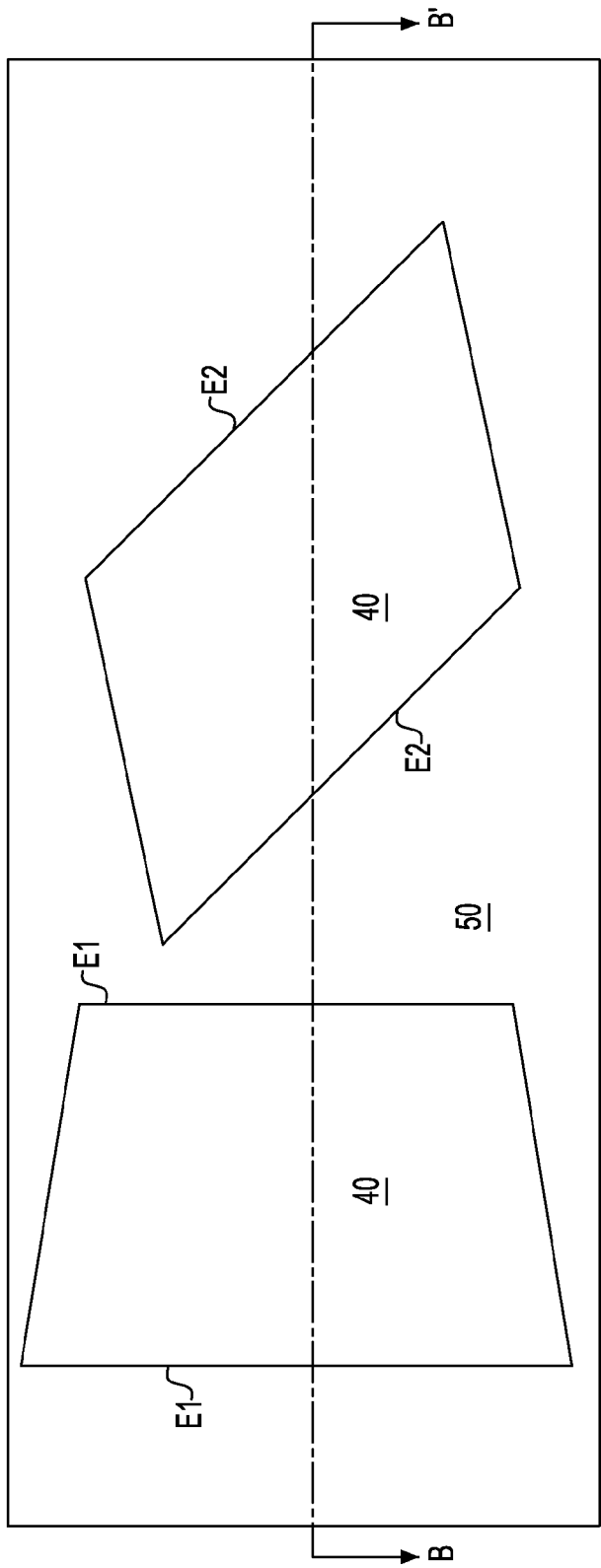
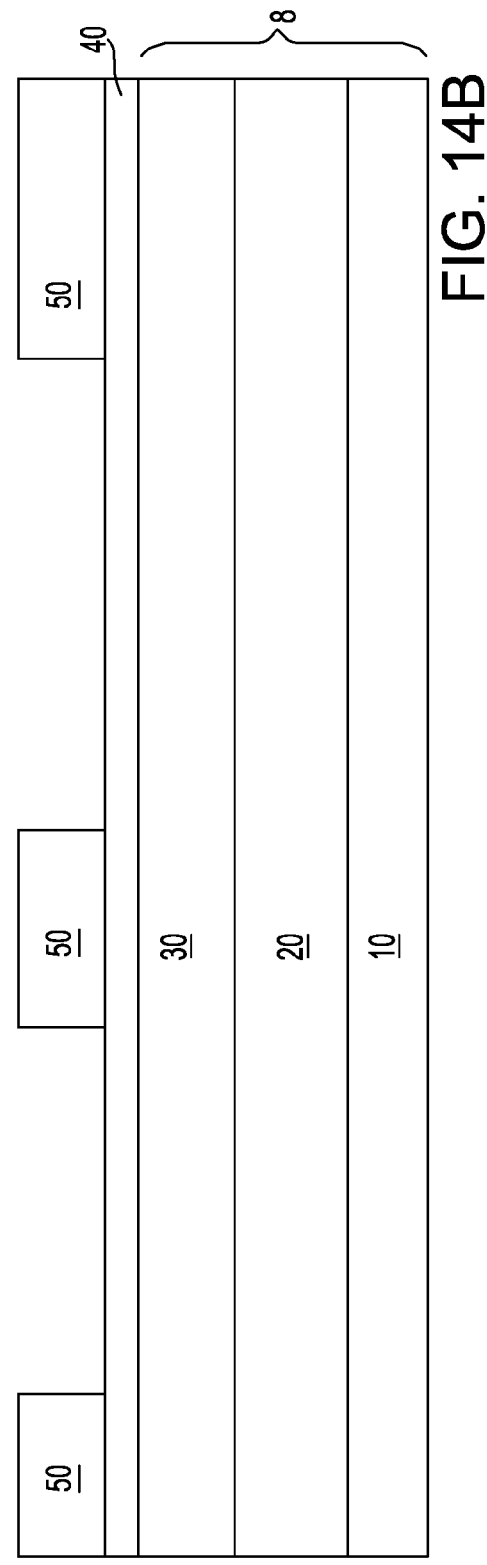

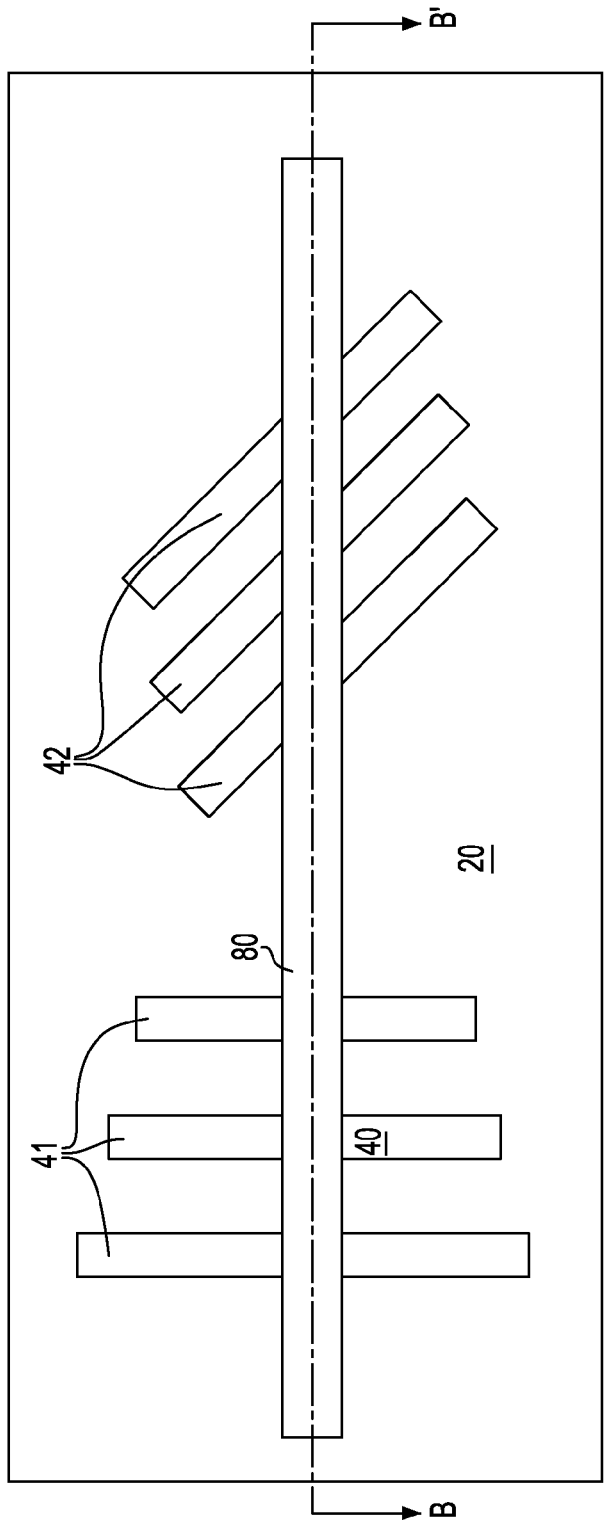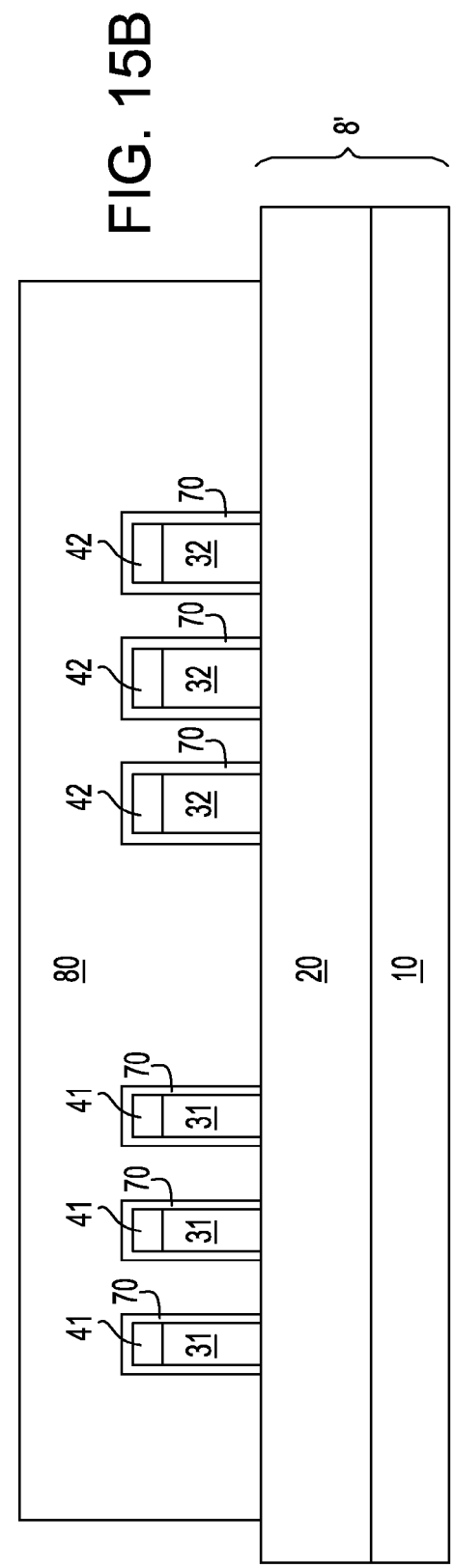
FIG. 15A
FIG. 15B

FINFET WITH SUBLITHOGRAPHIC FIN WIDTH

FIELD OF THE INVENTION

The present invention relates to semiconductor structures, and particularly to finFET structures having a sublithographic fin width and methods of manufacturing the same.

BACKGROUND OF THE INVENTION

A FinFET is a metal oxide semiconductor field effect transistor (MOSFET) formed on a semiconductor fin. FinFET technology is an emerging technology which provides solutions to metal-oxide-semiconductor field effect transistor (MOSFET) scaling problems at, and below, the 45 nm node. FinMOSFET structures include fin field effect transistors (finFETs), which comprise at least one narrow (preferably <10 nm wide) semiconductor fin gated on at least two opposing sides of each of the at least one semiconductor fin. FinFET structures are preferably formed on a semiconductor-on-insulator (SOI) substrate, because of low source/drain diffusion to substrate capacitance and ease of electrical isolation by shallow trench isolation structures.

A gate electrode is placed on at least two sides of a channel or is wrapped around the channel of the finFET. A gate dielectric separates the gate electrode and the channel of the finFET. A double gate finFET employs a double gate configuration in which the gate electrode is placed on two opposite sides of the channel. In a triple gate finFET, the gate electrode is placed on one more side of a typically rectangular channel of the transistor. In a quadruple gate finFET or a wrapped gate finFET, the gate electrode is placed on four sides of the channel.

In a typical finFET structure, at least one horizontal channel on a vertical sidewall is provided within the semiconductor "fin" that is set sideways, or edgewise, upon a substrate. Typically, the fin comprises a single crystalline semiconductor material with a substantially rectangular cross-sectional area. Also typically, the height of the fin is greater than width of the fin to enable higher on-current per unit area of semiconductor area used for the finFET structure.

A gate electrode located on at least two sides of the channel of the transistor is a common feature of finFETs known in the art. Increased number of sides on which the gate electrode controls the channel of the finFET enhances the controllability of the channel in a finFET compared to a planar MOSFET. Improved control of the channel allows smaller device dimensions with less short channel effects as well as larger electrical current that can be switched at high speeds. A finFET device has faster switching times, equivalent or higher current density, and much improved short channel control than the mainstream CMOS technology utilizing similar critical dimensions.

In order to obtain desirable control of short channel effects (SCEs), the semiconductor fin is thin enough in a device channel region to ensure forming fully depleted semiconductor devices. Typically, the thickness, or the horizontal width, of a fin in a finFET is less than two-thirds of its gate length in order to obtain good control of short channel effects.

While scaling down of the gate length of finFETs faces difficulties due to lithographic limitations, scaling down of the width of the finFETs faces ever more difficulties since the width of the fin needs to have an even smaller dimension than the gate length of the finFET.

In view of the above, there is a need to provide a finFET structure having a small fin width, and if possible, having a sublithographic fin width, and methods of manufacturing the same.

Further, it is well known that the mobility of minority carriers in transistors is affected by the crystallographic surface orientation on which the channel of the transistor is formed. By manipulating the transistor structure such that a favorable surface orientation is used for each type of transistors, both p-type field effect transistors (PFETs) and n-type field effect transistors (NFETs) with high minority carrier mobility may be formed in a CMOS transistor circuit.

In some semiconductors, electron mobility and hole mobility achieve maximum on different crystallographic planes. For example, the electron mobility in silicon achieves the maximum in {100} surface orientations and the minimum in {110} surface orientations within single crystal silicon. In contrast, the hole mobility is achieves the maximum in the {110} surface orientations and the minimum in the {100} surface orientations in single crystal silicon.

Therefore, there exists a need to provide a p-type finFET and an n-type finFET having different sidewall surface orientations so that channels may be formed in crystallographic planes that respectively optimize or maximize mobility of minority charge carriers, and methods of manufacturing the same.

Further, there exists a need to provide semiconductor structures that provides both a narrow fin width for enhanced short channel effect control and having fin sidewalls orientations that optimize or maximize mobility of minority charge carriers, and methods of manufacturing the same.

SUMMARY OF THE INVENTION

The present invention addresses the needs described above by providing finFETs having a sublithographic width, formed by employing self-aligned self-assembly polymers, and having optimized surface orientations for p-type finFETs and n-tye finFETs, respectively, and methods of manufacturing the same.

According to the present invention, an insulator layer is formed over a semiconductor layer, which may be for example, a top semiconductor layer of a semiconductor-on-insulator (SOI) substrate. The insulator layer is patterned to form a first recessed region having a set of two parallel edges. The first lengthwise direction, or the direction of the set of the two parallel edges, is along the vertical plane that provides an optimal carrier mobility surface for a first type finFET to be subsequently formed and employs the semiconductor material in the semiconductor layer as a channel. Preferably, a second recessed region having another set of two parallel edges is formed so that the direction of the another set of two parallel edges is along the vertical plane that that provides an optimal carrier mobility surface for a second type finFET.

Self-assembling block copolymers containing two or more different polymeric block components that are not immiscible with one another are applied within each of the recessed regions having a set of two parallel edges and annealed to form within each recessed region a set of parallel polymer block lines having a sublithographic width and containing a first polymeric block component. A second polymeric block component region separates the parallel polymer block lines. The second polymeric block component region is etched selective to the first polymeric block component and the insulator layer.

The pattern of sublithographic width lines is transferred into the semiconductor layer by etching the exposed portions of the semiconductor layer employing the set(s) of parallel polymer block lines as an etch mask to form sublithographic width semiconductor fins. After removing the remaining portions of the insulator layer and the set(s) of parallel polymer block lines, a set of parallel semiconductor fins having a sublithographic width are formed for each set of parallel polymer block lines. The semiconductor fins formed underneath the first and second recessed regions may have sidewalls for optimal carrier mobility for the first type finFET and the second type finFET, respectively. Gate conductors are formed followed by source and drain formation to form fin-FETs having a sublithographic width.

According to an aspect of the present invention, a semiconductor structure is provided, which comprises:

a plurality of parallel semiconductor fins located on a substrate, wherein each of the plurality of parallel semiconductor fins has a sublithographic width and is separated from an adjacent semiconductor fin by a sublithographic spacing;

a plurality of gate dielectric portions, wherein each of the plurality of gate dielectric portions abuts sidewalls of each of the plurality of parallel semiconductor fins; and a gate electrode abutting the plurality of gate dielectric portions.

In one embodiment, each of the plurality of parallel semiconductor fins has the same sublithographic width from about 10 nm to about 35 nm.

In another embodiment, each of the sublithographic spacing is the same sublithographic spacing from about 10 nm to about 35 nm.

In yet another embodiment, an angle between a lengthwise direction of the gate electrode and the sidewalls is non-orthogonal.

In still another embodiment, each of the plurality of parallel semiconductor fins comprises a semiconductor material selected from the group consisting of silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials.

In a further embodiment, the sidewalls have a surface orientation at which a carrier mobility is optimized for the material of the plurality of parallel semiconductor fins.

In yet further embodiment, the surface orientation is selected from the group consisting of {100}, {110}, {111}, {211}, {221}, {311}, {321}, {331}, and {332}.

According to another aspect of the present invention, a semiconductor structure is provided, which comprises:

a plurality of first parallel semiconductor fins located on a substrate, wherein each of the plurality of first parallel semiconductor fins has a first sublithographic width and separated from an adjacent semiconductor fin by a first sublithographic spacing;

a plurality of first gate dielectric portions, wherein each of the plurality of first gate dielectric portions abuts first sidewalls of each of the plurality of first parallel semiconductor fins, wherein the first sidewalls have a first surface orientation;

a first gate electrode abutting the plurality of first gate dielectric portions;

a plurality of second parallel semiconductor fins located on a substrate, wherein each of the plurality of second parallel semiconductor fins has a second sublithographic width and separated from an adjacent semiconductor fin by a second sublithographic spacing;

a plurality of second gate dielectric portions, wherein each of the plurality of second gate dielectric portions abuts second sidewalls of each of the plurality of second parallel semiconductor fins, wherein the second sidewalls have a second surface orientation which is different from the first surface orientation; and a second gate electrode abutting the plurality of second gate dielectric portions.

In one embodiment, each of the plurality of first parallel semiconductor fins and the plurality of second parallel semiconductor fins has the same sublithographic width from about 10 nm to about 35 nm.

In another embodiment, each of the first sublithographic spacing and the second sublithographic spacing is the same sublithographic spacing from about 10 nm to about 35 nm.

In yet another embodiment, at least one of a first angle between a lengthwise direction of the first gate electrode and the first sidewalls and a second angle between a lengthwise direction of the second gate electrode and the second sidewalls is non-orthogonal.

In still another embodiment, each of the plurality of first parallel semiconductor fins and the plurality of second parallel semiconductor fins comprises a semiconductor material selected from the group consisting of silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials.

In still yet another embodiment, the first sidewalls have a first surface orientation at which hole mobility is optimized for the material of the plurality of first parallel semiconductor fins and the second sidewalls have a second surface orientation at which electron mobility is optimized for the material of the plurality of second parallel semiconductor fins.

In a further embodiment, each of the first surface orientation and the second surface orientation is selected from the group consisting of {100}, {110}, {111}, {211}, {221}, {311}, {321}, {331}, and {332}, and wherein the first surface orientation is different from the second surface orientation.

According to a further aspect of the present invention, a method for fabricating a semiconductor structure is provided, which comprises:

forming an insulator layer on a semiconductor layer comprising a semiconductor material;

forming a recessed region having two parallel edges within the insulator layer;

applying self-assembling block copolymers within the recessed region;

forming a set of parallel polymer block lines having a first sublithographic width and containing a first polymeric block component within the recessed region; and etching the semiconductor layer employing the set of parallel polymer block lines as an etch mask to form a set of semiconductor fins having a second sublithographic width.

In one embodiment, the method further comprises:
forming a second polymeric block component region separating the set of parallel polymer block lines;
etching the second polymeric block component region; and
etching the insulator layer.

In another embodiment, the method further comprises:
forming another recessed region having two parallel edges within the insulator layer;
applying self-assembling block copolymers within the another recessed region;

forming another set of parallel polymer block lines having the first sublithographic width and containing the first polymeric block component within the another recessed region; and forming another set of semiconductor fins having the second sublithographic width, wherein sidewalls of the set of semiconductor fins have a surface orientation at which hole mobility is optimized for the semiconductor material and sidewalls of the another set of semiconductor fins have a surface orientation at which electron mobility is optimized for the semiconductor material.

In a further embodiment, the set of semiconductor fins has a sublithographic spacing.

BRIEF DESCRIPTION OF THE DRAWINGS

FIGS. 1A and 1B show a first exemplary semiconductor structure according to the present invention. FIG. 1A is a top-down view and FIG. 1B is a cross-sectional view along the plane B-B' in FIG. 1A.

FIGS. 3A-10B are sequential views of a third exemplary structure according to the present invention. Figures with the same numeric label correspond to the same stage of manufacturing; figures with the suffix "A" are top-down views; figures with the suffix "B" are vertical cross-sectional views along the plane B-B' of the corresponding figure with the same numeric label and the suffix "A."

FIG. 11A is a top-down view and FIG. 11B is a cross-sectional view along the plane B-B' in FIG. 11A.

FIGS. 14A-15B are sequential views of a sixth exemplary structure according to the present invention. Conventions for numeric labels and suffixes are the same as for FIGS. 3A-11B.

DETAILED DESCRIPTION OF THE INVENTION

Figure 2:
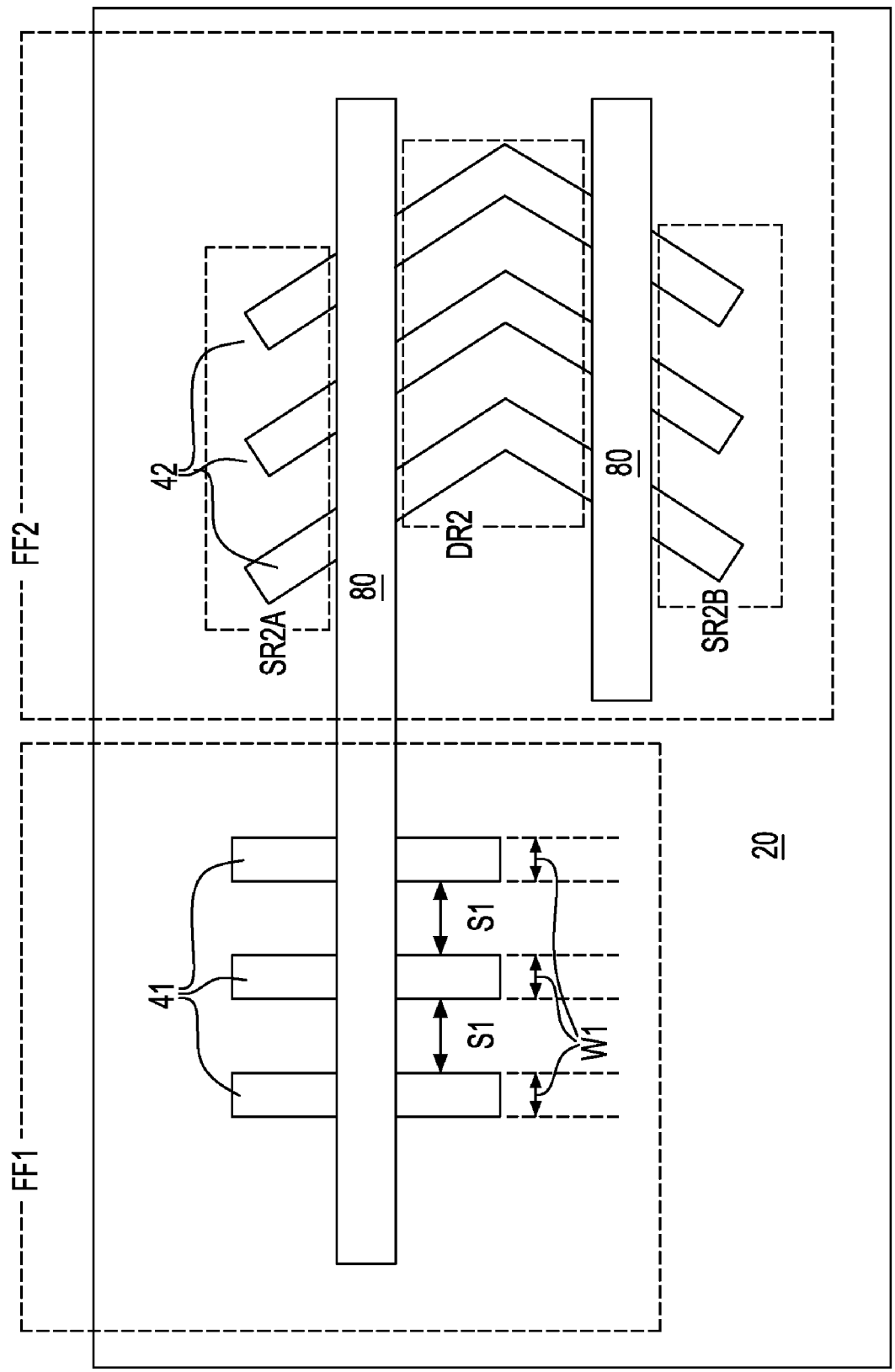
FIG. 2 shows a second exemplary semiconductor structure according to the present invention in a top-down view.

As stated above, the present invention relates to finFET structures having a sublithographic fin width and methods of manufacturing the same, which are now described in detail with accompanying figures. It is noted that like and corresponding elements are referred to by like reference numerals.

Referring to FIGS. 1A and 1B, a first exemplary structure according to the present invention is shown, which comprises a substrate 8' comprising a handle substrate 10 and a buried insulator layer 20. First semiconductor fins 31 and second semiconductor fins 32 are formed on the buried insulator layer 20. First semiconductor fins 31 having a first sublithographic width W1 and separated by a first sublithographic spacing S1 are present on the buried insulator layer 20. Similarly, second semiconductor fins 32 having a second sublithographic width W2 and separated by a second sublithographic spacing S2 are present on the buried insulator layer 20 as well. First fin caps 41 and second fin caps 42 are present on top surfaces of the first semiconductor fins 31 and the second semiconductor fins 32, respectively. A gate dielectric 70 is present on a middle portion of each of the first semiconductor fins 31 and second semiconductor fins 32. A gate electrode 80 is present on the gate dielectric 70.

First source regions SR1 are present on the portions of the first semiconductor fins 31 located on one side of the gate electrode 80 and first drain regions DR1 are present on the portions of the first semiconductor fins 31 located on the other side of the gate electrode 80. Similarly, second source regions SR2 are present on the portions of the second semiconductor fins 32 located on one side of the gate electrode 80 and second drain regions DR2 are present on the portions of the second semiconductor fins 32 located on the other side of the gate electrode 80. The first semiconductor fins 31 and the portion of the gate conductor 80 on the first semiconductor fins 31 comprise a first finFET FF1 and the second semiconductor fins 32 and the portion of the gate conductor 80 on the second semiconductor fins 32 comprise a second finFET FF2. The portion of the gate conductor 80 in the first finFET FF1 and the portion of the gate conductor 80 in the second finFET FF2 may, or may not be, connected.

The first angle α1 between the lengthwise direction of the gate conductor 80, which coincides with the plane B-B' in FIG. 1A, and the first direction D1 of the first semiconductor fins 31, i.e., the horizontal direction that is perpendicular to the direction of measurement of the first width W1, is orthogonal. The second angle α2 between the lengthwise direction of the gate conductor 80 and the second direction D2 of the second semiconductor fins 32, i.e., the horizontal direction that is perpendicular to the direction of measurement of the second width W1, is non-orthogonal. Preferably, the first and second semiconductor fins (31, 32) comprise a single crystalline semiconductor material.

Preferably, the planes of first sidewalls of the first semiconductor fins 31, i.e., the substantially vertical walls of the first semiconductor fins 31 containing the first direction D1 of the first semiconductor fins 31, have a surface orientation at which a carrier mobility is optimized or maximized for the material of the first semiconductor fins 31. The planes of first sidewalls of the first semiconductor fins 31 may have a surface orientation at which hole mobility or electron mobility is optimized or maximized for the material of the first semiconductor fins 31. Preferably, the planes of second sidewalls of the second semiconductor fins 32, i.e., the substantially vertical walls of the second semiconductor fins 32 containing the second direction D2 of the second semiconductor fins 32, also have a surface orientation at which a carrier mobility is optimized or maximized for the material of the first semiconductor fins 31.

The plane of second sidewalls of the second semiconductor fins 32 may be a surface orientation at which hole mobility or electron mobility is optimized or maximized for the material of the second semiconductor fins 32. It is noted that many crystallographic planes exhibit local maximum for a carrier mobility, in which case the carrier mobility is optimized with respect to infinitesimal variations in crystallographic orientations, but typically only one crystallographic plane manifests maximum carrier mobility, in which case the carrier mobility is maximized. Vertical surfaces of the first and second semiconductor fins (31, 32) adjoining the sidewalls on the same semiconductor fin (31, 32), having a sublithographic width (W1, or W2), and located at the ends of the semiconductor fin (31, 32) are herein referred to as "end walls."

The first semiconductor fins 31 and the second semiconductor fins 32 may have the same crystallographic orientations, i.e., the same orientations for the bulk crystalline structures. The first direction D1 of the first semiconductor fins 31 and the second direction D2 of the second semiconductor fins may be selected such that the first sidewalls have a first surface orientation at which hole mobility is optimized or maximized for the material of the first semiconductor fins 31 and the second sidewalls have a second surface orientation at which electron mobility is optimized or maximized for the material of second semiconductor fins 32. In a preferred embodiment of the present invention, the first finFET FF1 may be a p-type finFET and the second finFET FF2 may be an n-type finFET so that high carrier mobilities of the surface orientations of the first and second sidewalls provide enhanced on-current for the first finFET FF1 and the second finFET FF2.

The first semiconductor fins 31 are parallel among one another, i.e., the planes of the sidewalls of the first semiconductor fins 31 are parallel among one another. The second semiconductor fins 32 are also parallel among one another. Thus, a set of first semiconductor fins 31 or second semiconductor fins comprises a plurality of parallel semiconductor fins. The first sublithographic width W1 and the second sublithographic width W2 are preferably the same. The first sublithographic spacing S1 and the second sublithographic spacing S2 are preferably the same.

Referring to FIG. 2, a second exemplary semiconductor structure is shown, which has a second finFET FF2 having two sets of second semiconductor fins adjoined in the shape of multiple echelons. Second drain regions D2 is present in the adjoined portions of the second semiconductor fins, while an upper second source regions SR2A and a lower second source regions SR2B are present on the outside of a pair of gate conductors 80. The second exemplary structure illustrates an example of combinations of the elements of the present invention.

Methods of manufacturing the inventive structures according to the present invention are illustrated with a third exemplary structure. Referring to FIG. 3, an initial semiconductor substrate 8 comprises a handle substrate 10, a buried insulator layer 20, and a top semiconductor layer 30. A semiconductor-on-insulator (SOI) substrate may be employed to provide the initial semiconductor substrate 8. Alternately, the initial semiconductor substrate 8 may be a portion of a hybrid substrate having both a bulk portion and an SOI portion.

The handle substrate 10 may comprise a semiconductor material such as silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. Alternately, the handle substrate 10 may comprise a crystalline or a non-crystalline insulator material such as quartz, a dielectric oxide, and/or a dielectric nitride. In case the handle substrate 10 comprises an insulator, the buried insulator 20 is optional, i.e., the top semiconductor layer 30 may be located directly on the handle substrate 10.

The top semiconductor layer 30 comprises a semiconductor material such as silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. The semiconductor material may be doped with electrical dopants, or undoped. Typically, the dopant concentration is from about $1.0 \times 10^{14}/cm^3$ to about $1.0 \times 10^{18}/cm^3$. Portions of the top semiconductor layer 30 may be doped with different conductivity types, i.e., p-type and n-type. The thickness of the top semiconductor layer is typically from about 30 nm to about 300 nm, although lesser and greater thicknesses are explicitly contemplated herein. Preferably, the top semiconductor layer 30 is a single crystalline semiconductor layer.

Referring to FIGS. 4A and 4B, at least one insulator layer is formed on the top semiconductor layer 30. In one embodiment, a first insulator layer 40 may be formed directly on the top semiconductor layer 30 and a second insulator layer 50 may be formed directly on the first insulator layer 40. For example, the first insulator layer 40 may comprise an oxide such as a silicon oxide. The second insulator layer 50 may comprise a nitride such as silicon nitride. The thickness of the first insulator layer 40 may be from about 10 nm to about 30 nm, although larger or smaller thicknesses are also contemplated. The thickness of the second insulator layer 40 may be from about 30 nm to about 200 nm, although larger or smaller thicknesses are also contemplated. Embodiments in which only one insulator layer or additional number of insulator layers are employed are explicitly contemplated herein.

Referring to FIGS. 5A and 5B, a photoresist (not shown) is applied on the second insulator layer 50 and lithographically patterned. The pattern formed in the photoresist is transferred into the second insulator layer 50 by a reactive ion etch to form a first recessed region R1 having a set of two parallel edges E1 and a second recessed region R2 having another set of two parallel edges E2 within the second insulator layer 50. The first insulator layer 40 may be used as an etch stop during the reactive ion etch. In general, each of the first recessed region R1 and the second recessed region R2 may have a polygonal shape and/or may comprise a portion having an elliptical portion. Preferably, the distance, to be hereafter referred to as a "width," between the two parallel edges (E1 or E2) in each set is less than a "length" of the set of two parallel edge, wherein the length denotes the lesser of the two lengths of the two parallel edges in the set.

Preferably, the lengthwise direction, or the direction of the length, of each of the two recessed regions (R1, R2) is selected to coincide with a vertical plane that contains a surface orientation at which a carrier mobility is optimized or maximized for the material of the top semiconductor layer 30. For example, the vertical plane containing the lengthwise direction of the first recessed region R1 may have an orientation at which a first carrier mobility is optimized or maximized for the material of the top semiconductor layer 30, and the vertical plane containing the lengthwise direction of the second recessed region R2 may have an orientation at which a second carrier mobility is optimized or maximized for the material of the top semiconductor layer 30. In one embodiment, the first carrier mobility is hole mobility and the second carrier mobility is electron mobility. In another embodiment, the first carrier mobility is electron mobility and the second carrier mobility is hole mobility.

Preferably, the lengthwise directions of the first and second recessed regions (R1, R2) contains one of major crystallographic planes such as {100}, {110}, {111}, {211}, {221}, {311}, {321}, {331}, and {332}, at which a carrier mobility has a local maximum.

In case the top semiconductor layer comprises silicon, the first lengthwise direction may be a direction within one of the planes of maximum hole mobility, which are {110} planes, and the second lengthwise direction may be a direction within one of the planes of maximum electron mobility, which are {100} planes. For example, the orientation of the top surface of the top semiconductor layer may be a [001] orientation. The first lengthwise direction may be one of <110> orientations such as a [110] orientation and the second lengthwise direction may be one of <100> orientations such as a [100] orientation.

Figure 6A:
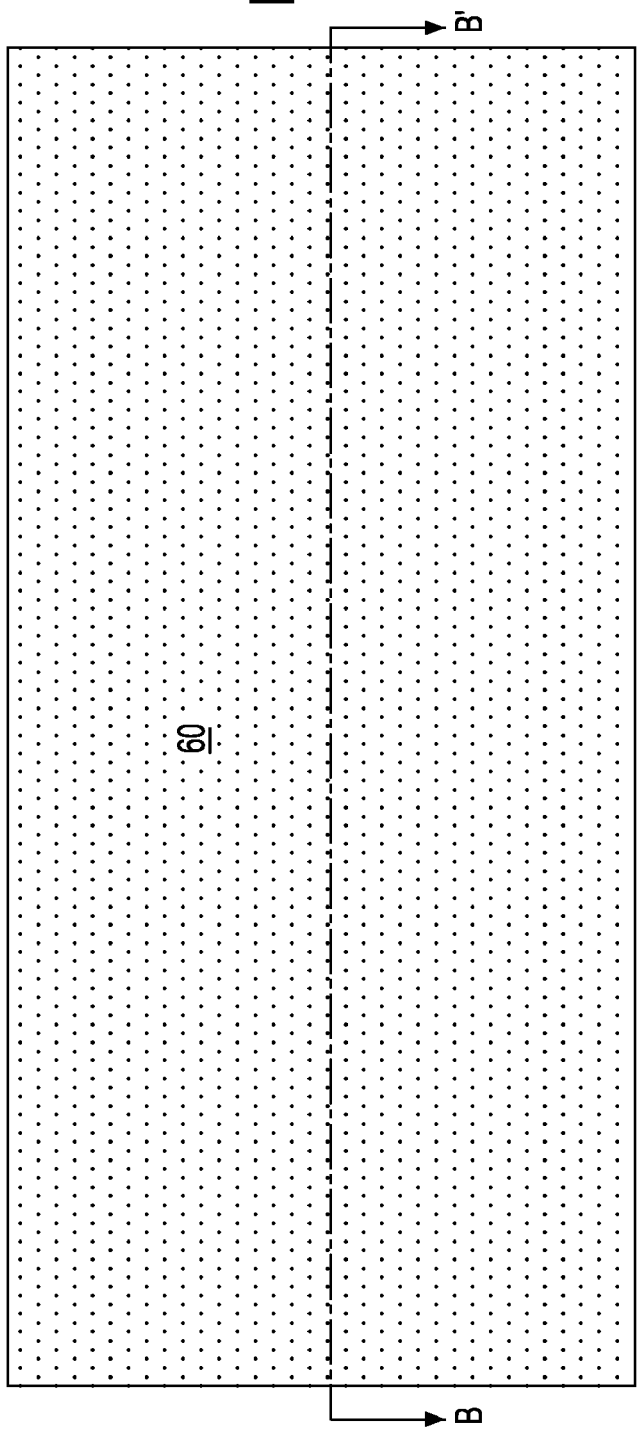
Figure 6B:
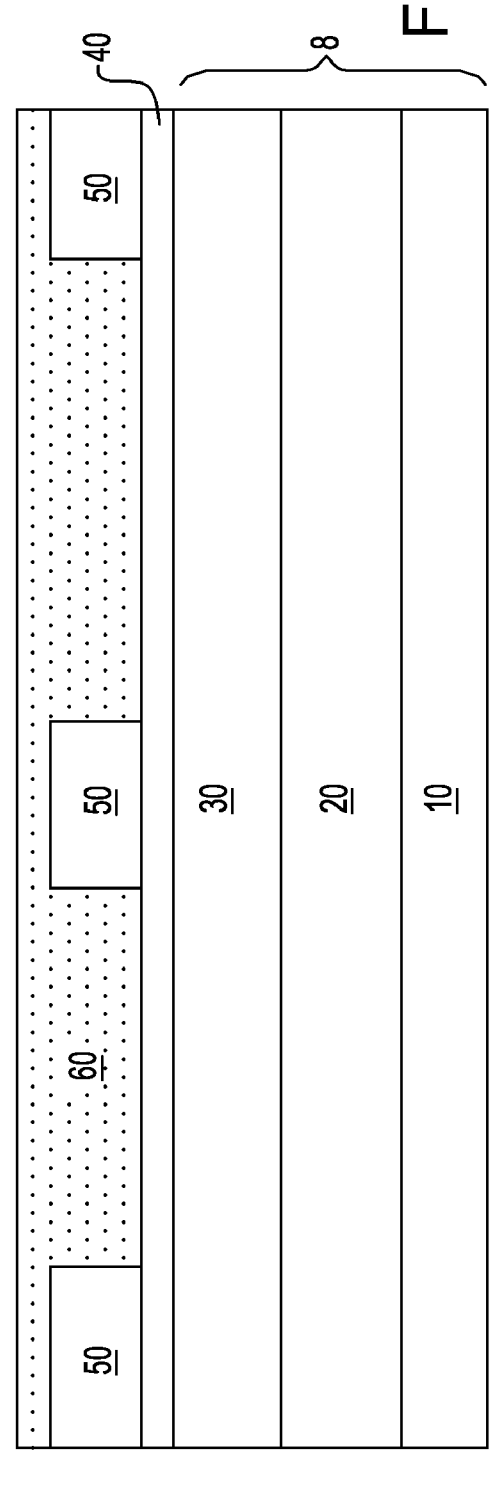

Referring to FIGS. 6A and 6B, a block copolymer layer 60 comprising self-assembling block copolymers that are capable of self-organizing into nanometer-scale patterns are applied over the third exemplary structure including the first recessed area R1 and the second recessed area R2. Under suitable conditions, the two or more immiscible polymeric block components separate into two or more different phases on a nanometer scale and thereby form ordered patterns of isolated nano-sized structural units. Such ordered patterns of isolated nano-sized structural units formed by the self-assembling block copolymers can be used for fabricating nano-scale structural units in semiconductor, optical, and magnetic devices. Specifically, dimensions of the structural units so formed are typically in the range of 10 to 35 nm, which are sub-lithographic (i.e., below the resolutions of the lithographic tools).

While a "lithographic minimum dimension" and a "sublithographic dimension" are defined only in relation to a lithography tool and normally changes from generation to generation of semiconductor technology, it is understood that the lithographic minimum dimension and the sublithographic dimension are to be defined in relation to the best performance of lithography tools available at the time of semiconductor manufacturing. As of 2007, the lithographic minimum dimension is about 50 nm and is expected to shrink in the future.

Exemplary materials for the block copolymer layer 60 are described in commonly-assigned, copending U.S. patent application Ser. No. 11/424,963, filed on Jun. 19, 2006, the contents of which are incorporated herein by reference. Specific examples of self-assembling block copolymers that can be used for forming the structural units of the present invention may include, but are not limited to: polystyrene-block-polymethylmethacrylate (PS-b-PMMA), polystyrene-block-polyisoprene (PS-b-PI), polystyrene-block-polybutadiene (PS-b-PBD), polystyrene-block-polyvinylpyridine (PS-b-PVP), polystyrene-block-polyethyleneoxide (PS-b-PEO), polystyrene-block-polyethylene (PS-b-PE), polystyrene-b-polyorganosilicate (PS-b-POS), polystyrene-block-polyferrocenyldimethylsilane (PS-b-PFS), polyethyleneoxide-block-polyisoprene (PEO-b-PI), polyethyleneoxide-block-polybutadiene (PEO-b-PBD), polyethyleneoxide-block-polymethylmethacrylate (PEO-b-PMMA), polyethyleneoxide-block-polyethylethylene (PEO-b-PEE), polybutadiene-block-polyvinylpyridine (PBD-b-PVP), and polyisoprene-block-polymethylmethacrylate (PI-b-PMMA). The self-assembling block copolymers are first dissolved in a suitable solvent system to form a block copolymer solution, which is then applied onto the surface of the first exemplary structure to form a block copolymer layer 60. The solvent system used for dissolving the block copolymer and forming the block copolymer solution may comprise any suitable solvent, including, but not limited to: toluene, propylene glycol monomethyl ether acetate (PGMEA), propylene glycol monomethyl ether (PGME), and acetone.

Referring to FIGS. 7A and 7B, the third exemplary semiconductor structure is annealed at an elevated temperature to form first parallel polymer block lines 61 and second parallel polymer block lines 62 containing a first polymeric block component. A second polymeric block region 63 containing a second polymeric block component is formed outside the first and second parallel polymer block lines (61, 62). Exemplary processes of annealing the self-assembling block copolymers in the block copolymer layer 60 to form two sets of polymer blocks are described in Nealey et al., "Self-assembling resists for nanolithography," IEDM Technical Digest, December, 2005, Digital Object Identifier 10.1109/IEDM.2005.1609349, the contents of which are incorporated herein by reference. Further, methods of annealing described in the '963 application may be employed. The anneal may be performed, for example, at a temperature from about 200° C. to about 300° C. for a duration from less than about 1 hour to about 100 hours.

Preferably, the width is less than the length for each of the first and second recessed regions (R1, R2) as noted above, and consequently, the direction of the first parallel polymer block lines 61 and second parallel polymer block lines 62 coincide with the lengthwise direction of the first and second recessed regions (R1, R2), respectively. The width of the first parallel polymer block lines 61 and second parallel polymer block lines 62 may be from about 10 nm to about 35 nm. The spacing between an adjacent pair of first parallel polymer block lines 61 or between adjacent pair of second parallel polymer block lines 62 may be from about 10 nm to about 35 nm.

Referring to FIGS. 8A and 8B, the portions containing the second polymeric block component, i.e., the second polymeric block region 63, is removed by a reactive ion etch selective to the portions containing the first polymeric block component, i.e., the first parallel polymer block lines 61 and second parallel polymer block lines 62. In other words, the reactive ion etch removes the portions containing the second polymeric block component while substantially preserving the portions containing the first polymeric block component. Further, the second insulator layer 50 is removed by an etch selective to the first parallel polymer block lines 61, second parallel polymer block lines 62, and the first insulator layer 40. A wet etch or a reactive ion etch may be employed.

Referring to FIGS. 9A and 9B, the pattern formed by the first parallel polymer block lines 61 and second parallel polymer block lines 62 is transferred by a reactive ion etch into the first insulator layer 40 and into the top semiconductor layer 30 to form a plurality of first semiconductor fins 31 and a plurality of second semiconductor fins 32. The remaining portions of the first insulator layer 40 underneath the first parallel polymer block lines 61 after the reactive ion etch constitute first fin caps 41, and the remaining portions of the first insulator layer 40 underneath the second parallel polymer block lines 62 after the reactive ion etch constitute second fin caps 42. The remaining portions of the top semiconductor layer 30 underneath the first fin caps 41 after the reactive ion etch constitute the first semiconductor fins 31, and the remaining portions of the top semiconductor layer 30 underneath the second fin caps 42 after the reactive ion etch constitute the second semiconductor fins 32. The handle substrate 10 and the buried oxide layer collectively constitute a substrate 8'.

Each of the first and second semiconductor fins (31, 32) have two parallel sidewalls that are substantially vertical and containing the lengthwise direction of the first recessed region R1 or the second recessed region R2. The sidewalls of the first and second semiconductor fins (31, 32) have a surface orientation at which a carrier mobility is optimized or maximized for the material of the top semiconductor layer 30. For example, sidewalls of the first semiconductor fins 31 may have an orientation at which a first carrier mobility is optimized or maximized for the material of the top semiconductor layer 30, and the sidewalls of the second semiconductor fins 32 may have an orientation at which a second carrier mobility is optimized or maximized for the material of the top semiconductor layer 30. In one embodiment, the first carrier mobility is hole mobility and the second carrier mobility is electron mobility. In another embodiment, the first carrier mobility is electron mobility and the second carrier mobility is hole mobility. The sidewalls of the first and second semiconductor fins (31, 32) may contain one of major crystallographic planes such as {100}, {110}, {111}, {211}, {221}, {311}, {321}, {331}, and {332}, at which a carrier mobility has a local maximum.

In case the top semiconductor layer comprises silicon, the sidewalls of the first semiconductor fins 31 may have a surface orientation at which hole mobility is maximized, i.e., may be one of {110} planes, and the sidewalls of the second semiconductor fins 32 may have a surface orientation at which electron mobility is maximized, i.e., may be one of {100} planes. For example, the orientation of the top surface of the top semiconductor layer may be a [001] orientation. The sidewalls of the first semiconductor fins 31 may have a (110) plane, which is perpendicular to a [110] orientation, and the sidewalls of the second semiconductor fins 32 may have a (100) plane, which is perpendicular to a [100] orientation. For another example, the orientation of the top surface of the top semiconductor layer may be a [011] orientation. The sidewalls of the first semiconductor fins 31 may have a (01$\bar{1}$) plane and the sidewalls of the second semiconductor fins 32 may have a (100) plane.

The widths of the first semiconductor fins 31 and the second semiconductor fins 32 may be sublithographic, for example, from about 10 nm to about 35 nm. The spacing between adjacent pairs of the first semiconductor fins 31 or between adjacent pairs of the second semiconductor fins 32 may be sublithographic, for example, from about 10 nm to about 35 nm. The height of the first semiconductor fins 31 and the second semiconductor fins 32 is the same as the thickness of the top semiconductor layer 30, and may be from about 30 nm to about 300 nm.

Figure 10A:
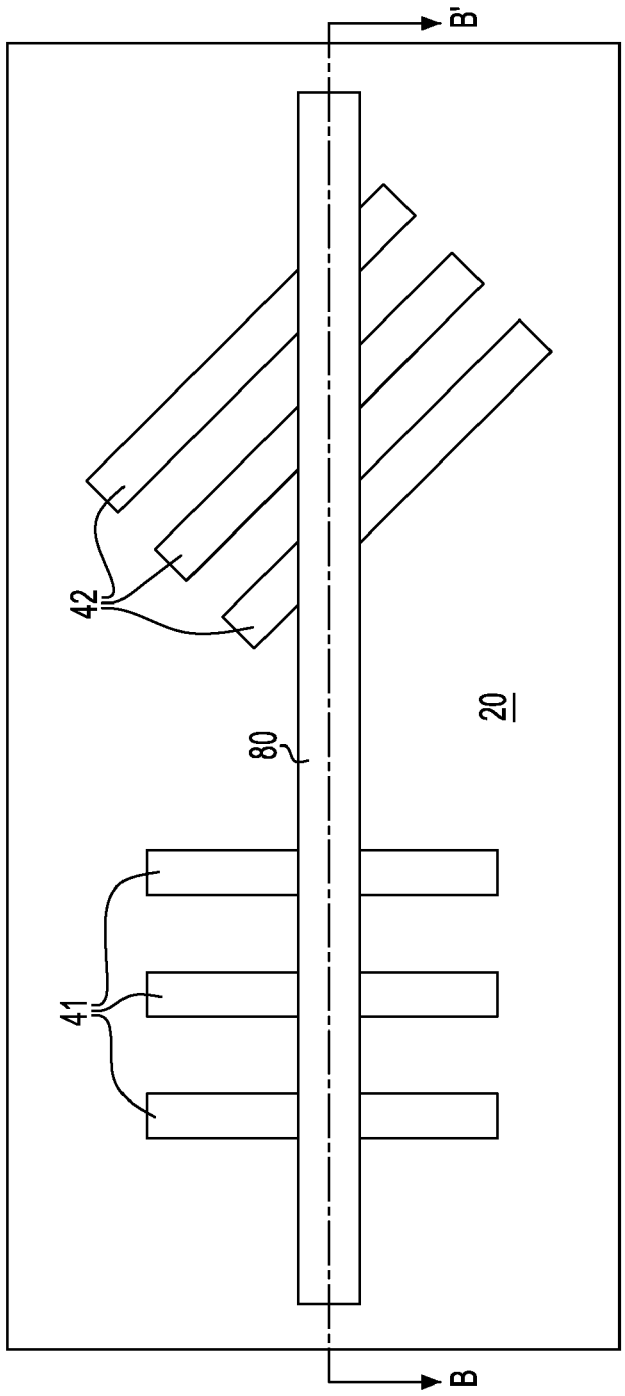
Figure 10B:
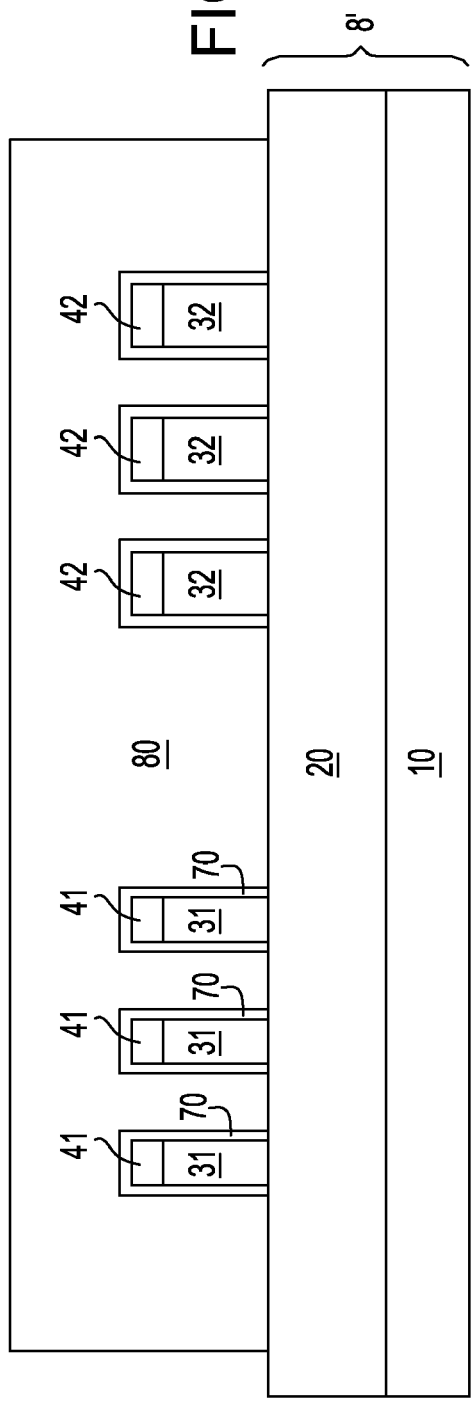

Referring to FIGS. 10A and 10B, a gate dielectric 70 is formed on the first and second semiconductor fins (31, 32).

The gate dielectric 70 may comprises a dielectric material having a dielectric constant of about 3.9 or greater. The dielectric constants mentioned herein are relative to a vacuum. Note that $SiO_2$ typically has a dielectric constant that is about 3.9. Specifically, the gate dielectric 70 may comprise a conventional gate dielectric material such as silicon oxide, silicon nitride, silicon oxynitride and/or a stack thereof. Alternately, the gate dielectric 30 may comprise a high-K dielectric material such as $HfO_2$, $ZrO_2$, $Al_2O_3$, $TiO_2$, $La_2O_3$, $SrTiO_3$, $LaAlO_3$, $Y_2O_3$ and mixtures thereof. The physical thickness of the gate dielectric 70 may vary, but typically, the gate dielectric has a thickness from about 0.5 nm to about 10 nm, with a thickness from about 1 nm to about 3 nm being more typical.

A gate electrode 80 is formed by depositing and lithographically patterning and etching a silicon containing gate conductor layer (not shown). The gate electrode 80 may comprise a silicon containing material such as an amorphous silicon, an amorphous silicon containing alloy, a polysilicon and/or a polycrystalline silicon containing alloy. Exemplary silicon containing alloys are silicon germanium alloy, silicon carbon alloy, and silicon germanium carbon alloy. The silicon containing material may be doped with dopants such as B, Ga, In, P, As, and/or Sb, or may be substantially undoped. The thickness, i.e., height, of the silicon containing gate conductor layer 31 may vary depending on the technique used in forming the same. Typically, the silicon containing gate conductor layer 31 has a vertical thickness from about 20 to about 200 nm, with a thickness from about 40 to about 150 nm being more typical. The silicon containing gate conductor layer 31 may be deposited, for example, by low pressure chemical vapor deposition (LPCVD) or rapid thermal chemical vapor deposition (RTCVD).

Alternately, the gate electrode 80 may be a metal gate electrode. In this case, a metal gate layer (not shown) is formed directly on the gate dielectric 70, for example, by chemical vapor deposition (CVD), physical vapor deposition (PVD), atomic layer deposition (ALD), etc. The metal gate layer comprises a conductive refractory metal nitride. For example, the metal gate layer may comprise a material such as TaN, TiN, WN, TiAlN, TaCN, other conductive refractory metal nitride, or an alloy thereof. The thickness of the metal gate layer may be from about 5 nm to about 40 nm, and preferably from about 7 nm to about 20 nm. By lithographically patterning and etching the metal gate layer, the gate electrode 80 is formed on the first and second semiconductor fins (31, 32).

Typically, the exposed portions of the gate dielectric 70 after formation of the gate electrode 80 are etched. Thus, the gate dielectric 70 may be a plurality of gate dielectric portions, wherein each of the plurality of gate dielectric portions abuts sidewalls of each of the plurality of first semiconductor fins 31 and second semiconductor fins. The sidewalls of the first semiconductor fins 31 are parallel among one another, and the first semiconductor fins 31 collectively form a plurality of first parallel semiconductor fins. Likewise, the sidewalls of the second semiconductor fins 32 are parallel among one another, and the second semiconductor fins 32 collectively form a plurality of second parallel semiconductor fins.

First source regions may be formed on the portions of the first semiconductor fins 31 located on one side of the gate electrode 80 and first drain regions may be formed on the portions of the first semiconductor fins 31 located on the other side of the gate electrode 80. Similarly, second source regions may be formed on the portions of the second semiconductor fins 32 located on one side of the gate electrode 80 and second drain regions DR2 may be formed on the portions of the second semiconductor fins 32 located on the other side of the gate electrode 80. At this point, the third exemplary semiconductor structure is the same as the first semiconductor structure, having the same structural characteristics.

Figure 11A:
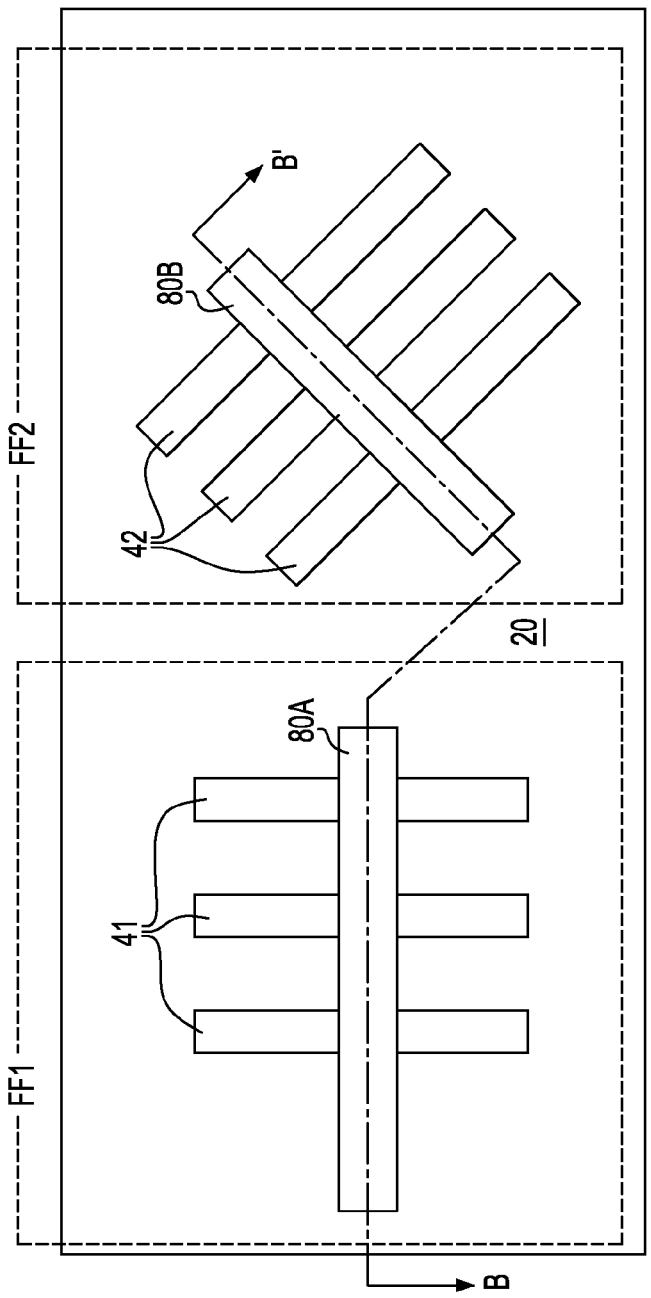
FIGS. 11A and 11B show a fourth exemplary semiconductor structure according to the present invention.
Figure 11B:
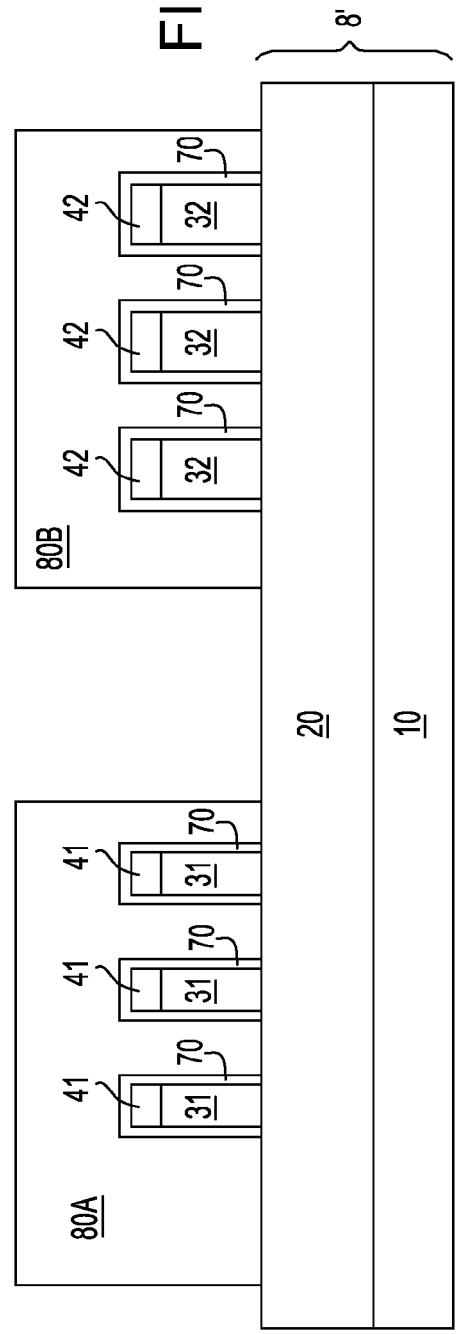

Many variations on the previously described exemplary structures are possible according to the present invention. Referring to FIGS. 11A and 11B, a fourth exemplary structure according to the present invention has a first gate electrode 80A and a second gate electrode 80B. In the fourth exemplary semiconductor structure, sidewalls of the first semiconductor fins 31 have a surface orientation at which hole mobility is optimized. Preferably, hole mobility is maximized at the surface orientation of the sidewalls of the first semiconductor fins 31. Also, sidewalls of the second semiconductor fins 32 have a surface orientation at which electron mobility is optimized. Preferably, electron mobility is maximized at the surface orientation of the sidewalls of the second semiconductor fins 32.

The angle between the direction of the first gate electrode 80A, which coincide with the direction of the dotted line in the first gate electrode 80A, and the sidewalls of the first semiconductor fins 31 is orthogonal. Likewise, the angle between the direction of the second gate electrode 80B, which coincides with the direction of the dotted line in the second gate electrode 80B, and the sidewalls of the second semiconductor fins 32 is orthogonal as well.

Source and drain regions are formed in the first and second semiconductor fins (31, 32) to form a first finFET FF1 comprising the first gate electrode 80A and the first semiconductor fins 31 and a second finFET FF2 comprising the second gate electrode 80B and the second semiconductor fins 32. The dimensions of the first and second semiconductor fins (31, 32) and the spacing between adjacent pairs of the first and second semiconductor fins (31, 32) are sublithographic as in the previous embodiments.

Figure 12A:
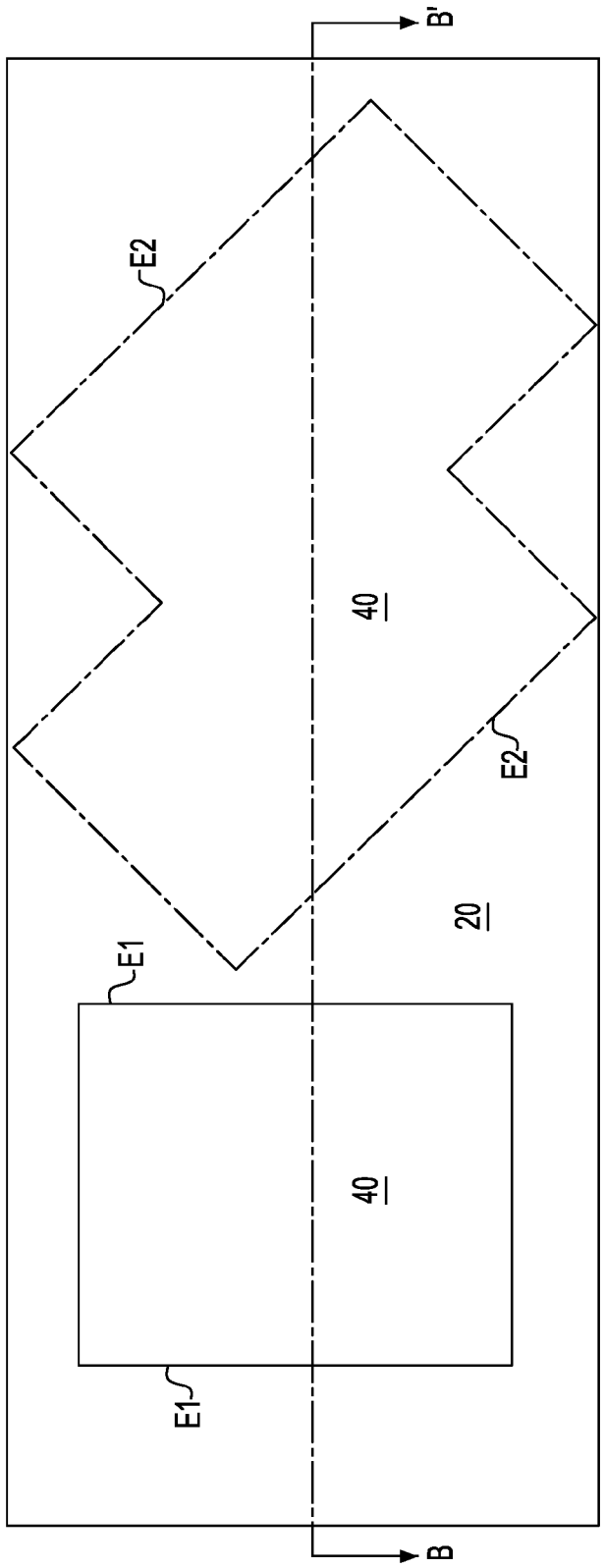
FIGS. 12A-13B are sequential views of a fifth exemplary structure according to the present invention. Conventions for numeric labels and suffixes are the same as for FIGS. 3A-11B.
Figure 12B:
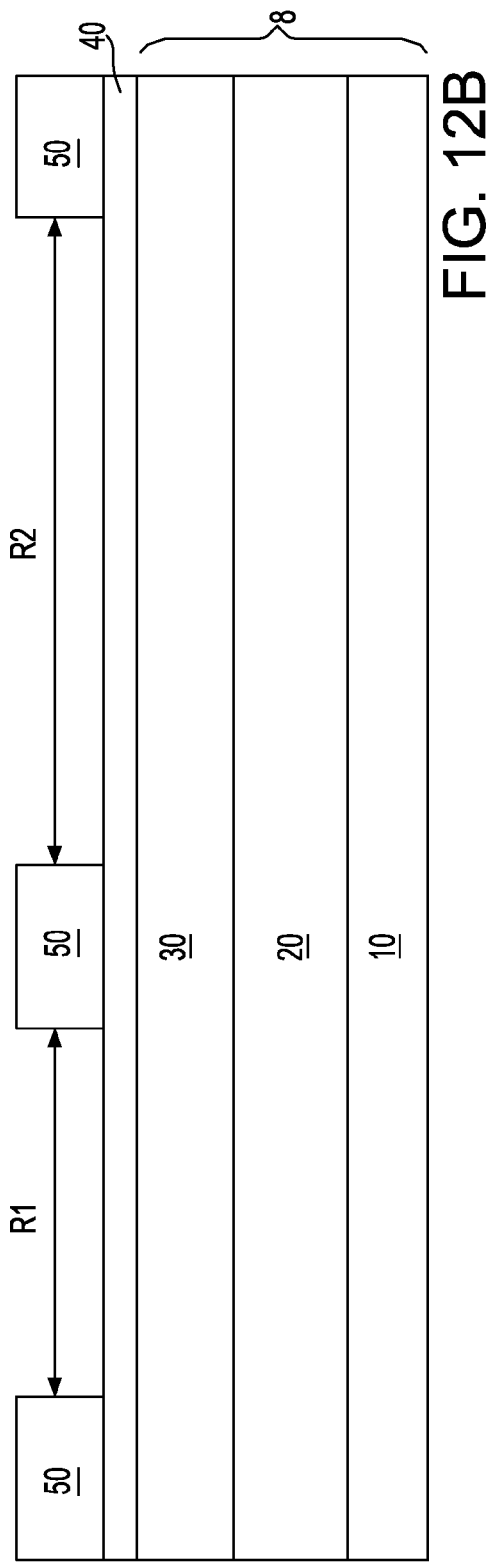

Referring to FIGS. 12A and 12B, a fifth exemplary semiconductor structure is shown at a step corresponding to FIGS. 5A and 5B. The fifth exemplary semiconductor structure comprises a first recessed region R1 having a rectangular shape as seen in a top down view and a second recessed region R2 having a octalateral polygonal shape as seen in the top down view. The first recessed region R1 contains a set of two parallel edges E1, and the second recessed region R2 contains another set of two parallel edges E2 within the second insulator layer 50. In the second recessed region R2, the distance, to be hereafter referred to as a "width," between the two parallel edges (E1 or E2) in each set may, or may not be, less than a "length" of the set of two parallel edge, wherein the length denotes the lesser of the two lengths of the two parallel edges in the set. By manipulating the shape of the second recessed region R2, the second parallel polymer block lines containing a first polymeric block component may be formed along the direction of the another set of two parallel edges E2. In general, it is not necessary that the "width" of any recessed region to be less than the "length" of the recessed region.

Figure 13A:
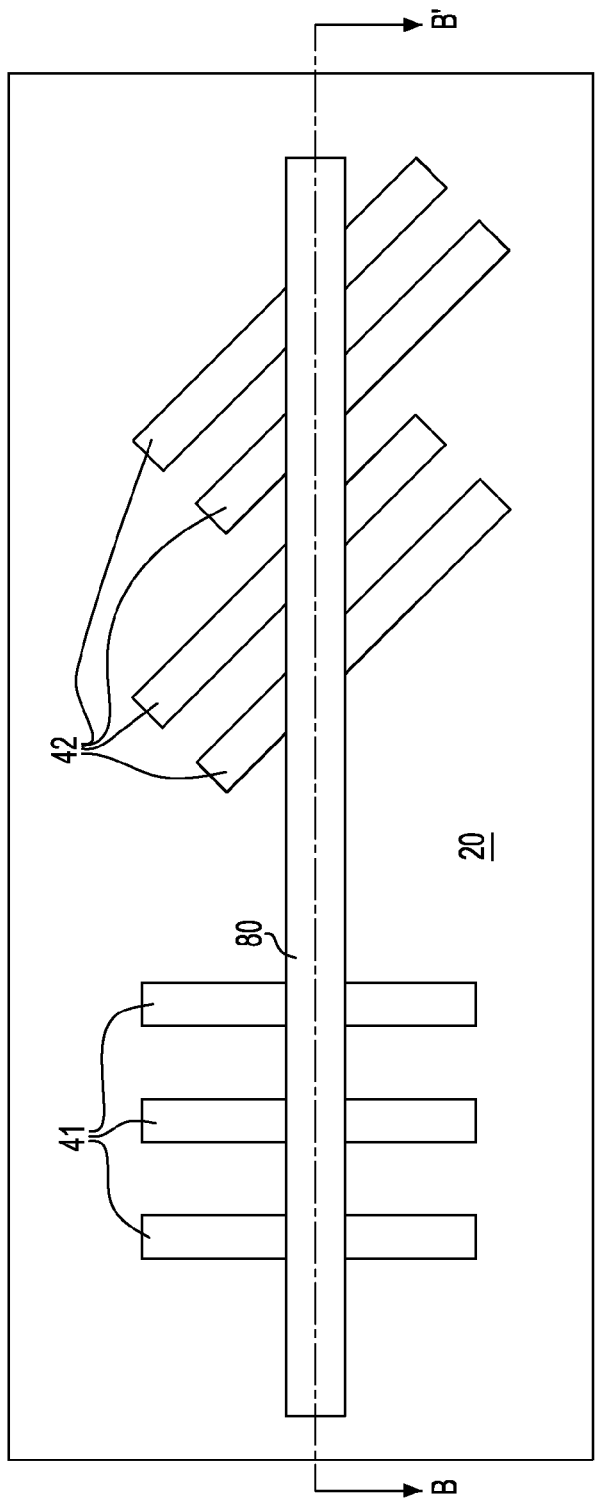
Figure 13B:
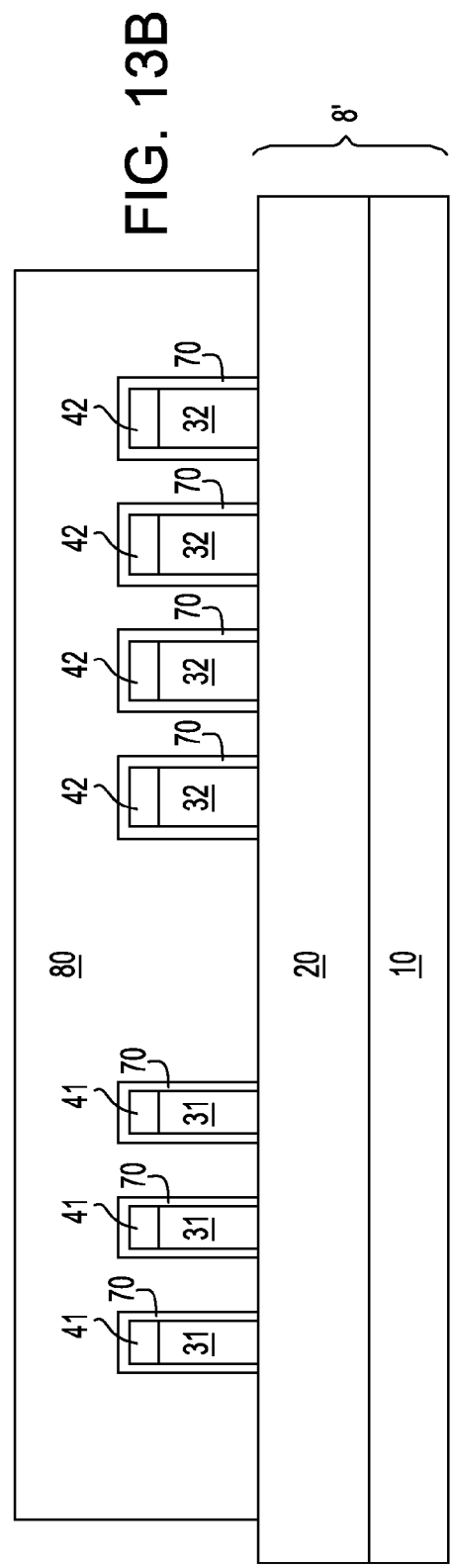

Referring to FIGS. 13A and 13B, the fifth exemplary semiconductor structure is shown at a step corresponding to FIGS. 10A and 10B. While the end walls of the first semiconductor fins 31 located on the same side of the gate conductor 80 are substantially coplanar, the end walls of the second semiconductor fins 32 located on the same side of the gate conductor 80 are staggered and not coplanar. In general, the end walls of semiconductor fins may or may not be coplanar.

Referring to FIGS. 14A and 14B, a sixth exemplary semiconductor structure is shown at a step corresponding to FIGS. 5A and 5B. The sixth exemplary semiconductor structure comprises a first recessed region R1 having a first trapezoidal shape as seen in a top down view and a second recessed region R2 having a second trapezoidal shape as seen in the top down view. In general, a trapezoid is a quadrilateral having two parallel sides. The first recessed region R1 contains a set of two parallel edges E1, and the second recessed region R2 contains another set of two parallel edges E2 within the second insulator layer 50. The length of a set of two parallel edges (E1 or E2) may be different as in the set of two parallel edges E1 in the first recessed region R1, or may be the same as in the set of two parallel edges E2 in the second recessed region R2. In general, a set of two parallel edges may have the same length or different lengths. The angles between one of the parallel edges and an adjacent side of a recessed region may, or may not, be orthogonal.

Referring to FIGS. 15A and 15B, the sixth exemplary semiconductor structure is shown at a step corresponding to FIGS. 10A and 10B. The first semiconductor fins 31 have different lengths, while the second semiconductor fins 32 have the same length. In general, semiconductor fins may have the same length, or different lengths.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A method for fabricating a semiconductor structure comprising:
    forming an insulator layer on a semiconductor layer comprising a semiconductor material;
    forming a recessed region having two parallel edges within said insulator layer;
    applying self-assembling block copolymers within said recessed region;
    forming a set of parallel polymer block lines having a first sublithographic width and containing a first polymeric block component within said recessed region;
    etching said semiconductor layer employing said set of parallel polymer block lines as an etch mask to form a set of semiconductor fins having a second sublithographic width;
    forming a plurality of parallel semiconductor fins on said substrate, wherein each of said plurality of parallel semiconductor fins has substantially vertical walls, wherein said substantially vertical sidewalls have a surface orientation at which a carrier mobility is optimized or maximized for said semiconductor material;
    forming a plurality of gate dielectric portions directly on said substantially vertical walls; and
    forming a gate electrode abutting said plurality of gate dielectric portions.

2. The method of claim 1, further comprising:
    forming a second polymeric block component region separating said set of parallel polymer block lines;
    etching said second polymeric block component region; and
    etching said insulator layer.

3. The method of claim 1, wherein said surface orientation is selected from the group consisting of {100}, {110}, {111}, {211}, {221}, {311}, {321}, {331}, and {332}.

4. The method of claim 1, further comprising:
    forming another recessed region having two parallel edges within said insulator layer;
    applying self-assembling block copolymers within said another recessed region; forming another set of parallel polymer block lines having said first sublithographic width and containing said first polymeric block component within said another recessed region; and forming another set of semiconductor fins having said second sublithographic width, wherein sidewalls of said set of semiconductor fins have a surface orientation at which hole mobility is optimized or maximized for said semiconductor material and sidewalls of said another set of semiconductor fins have a surface orientation at which electron mobility is optimized or maximized for said semiconductor material.

5. The method of claim 1, wherein said set of semiconductor fins has a sublithographic spacing.

6. The method of claim 1, wherein each of said plurality of parallel semiconductor fins has a sublithographic width and is separated from an adjacent semiconductor fin by a sublithographic spacing.

7. The method of claim 6, wherein each of said plurality of parallel semiconductor fins has the same sublithographic width from about 10 nm to about 35 nm.

8. The method of claim 6, wherein each of said sublithographic spacing is the same sublithographic spacing from about 10 nm to about 35 nm.

9. The method of claim 6, wherein an angle between a lengthwise direction of said gate electrode and said substantially vertical walls is non-orthogonal.

10. The method of claim 6, wherein each of said plurality of parallel semiconductor fins comprises a semiconductor material selected from the group consisting of silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials.

11. A method for fabricating a semiconductor structure comprising:
    forming an insulator layer on a semiconductor layer comprising a semiconductor material;

forming a recessed region having two parallel edges within said insulator layer;

applying self-assembling block copolymers within said recessed region;

forming a set of parallel polymer block lines having a first sublithographic width and containing a first polymeric block component within said recessed region;

etching said semiconductor layer employing said set of parallel polymer block lines as an etch mask to form a set of semiconductor fins having a second sublithographic width;

forming a plurality of parallel semiconductor fins on said substrate, wherein each of said plurality of parallel semiconductor fins has substantially vertical walls;

forming a plurality of gate dielectric portions directly on said substantially vertical walls; and forming a gate electrode abutting said plurality of gate dielectric portions, wherein an angle between a lengthwise direction of said gate electrode and said substantially vertical walls is non-orthogonal.

* * * * *